(12) United States Patent
Popovich

(10) Patent No.: US 7,599,626 B2
(45) Date of Patent: Oct. 6, 2009

(54) COMMUNICATION SYSTEMS INCORPORATING CONTROL MESHES

(75) Inventor: John M. Popovich, Solana Beach, CA (US)

(73) Assignee: Waytronx, Inc., Tualatin, OR (US)

( * ) Notice: Subject to any disclaimer, the term of this patent is extended or adjusted under 35 U.S.C. 154(b) by 259 days.

(21) Appl. No.: 11/314,400

(22) Filed: Dec. 20, 2005

(65) Prior Publication Data

US 2006/0140630 A1    Jun. 29, 2006

Related U.S. Application Data

(60) Provisional application No. 60/638,809, filed on Dec. 23, 2004, provisional application No. 60/641,399, filed on Jan. 5, 2005, provisional application No. 60/641,423, filed on Jan. 5, 2005.

(51) Int. Cl.
*H04B 10/00* (2006.01)
(52) U.S. Cl. .................................. 398/164; 398/200
(58) Field of Classification Search ................ 398/164, 398/200, 201
See application file for complete search history.

(56) References Cited

U.S. PATENT DOCUMENTS

| | | |
|---|---|---|
| 4,241,277 A | 12/1980 | Hintze et al. |
| 4,394,600 A | 7/1983 | Flannagan |
| 4,937,654 A | 6/1990 | Hirabayashi |
| 5,049,855 A | 9/1991 | Slemon et al. |
| 5,059,373 A | 10/1991 | Hirabayashi |
| 5,471,371 A | 11/1995 | Koppolu et al. |
| 5,478,778 A | 12/1995 | Tanisawa |
| 5,550,721 A | 8/1996 | Rapisarda |
| 5,632,551 A | 5/1997 | Roney et al. |
| 5,719,444 A | 2/1998 | Tilton et al. |
| 5,746,497 A | 5/1998 | Machida |
| 6,116,759 A | 9/2000 | Smith |
| 6,175,342 B1 | 1/2001 | Nicholson et al. |
| 6,215,464 B1 | 4/2001 | Jensen |
| 6,238,056 B1 | 5/2001 | Rapisarda |
| 6,283,613 B1 | 9/2001 | Schaffer |
| 6,390,643 B1 | 5/2002 | Knight |
| 6,402,347 B1 | 6/2002 | Maas et al. |
| 6,480,389 B1 | 11/2002 | Shie et al. |
| 6,652,127 B2 | 11/2003 | Tarabula |
| 6,831,305 B2 | 12/2004 | Yasukawa et al. |
| 2002/0074557 A1 | 6/2002 | Uda et al. |
| 2003/0048912 A1 | 3/2003 | Reich |
| 2003/0063463 A1 | 4/2003 | Sloan et al. |
| 2003/0098460 A1 | 5/2003 | Yasukawa et al. |
| 2003/0112627 A1 | 6/2003 | Deese |
| 2004/0125515 A1 | 7/2004 | Popovich |

FOREIGN PATENT DOCUMENTS

EP    377352 A1    7/1990

(Continued)

*Primary Examiner*—Christina Y Leung
(74) *Attorney, Agent, or Firm*—William W. Haefliger

(57) ABSTRACT

The method of communicating with circuitry that includes providing a woven mesh having elongated conductive elements extending in array forming directions relative to the circuitry, establishing communication sites associated with the mesh elements, located in spaced apart relation, and operating the sites via the mesh to communicate optically with the circuitry, having detection capability.

26 Claims, 22 Drawing Sheets
(19 of 22 Drawing Sheet(s) Filed in Color)

FOREIGN PATENT DOCUMENTS

| | | | | | | |
|---|---|---|---|---|---|---|
| JP | 57095682 | | 6/1982 | JP | 05074975 A | 3/1993 |
| JP | 04290478 | A | 10/1992 | JP | 05134615 A | 5/1993 |
| JP | 05072978 | A | 3/1993 | JP | 06151915 A | 5/1994 |
| | | | | JP | 06314863 A | 11/1994 |
| | | | | JP | 2003223121 A | 8/2003 |

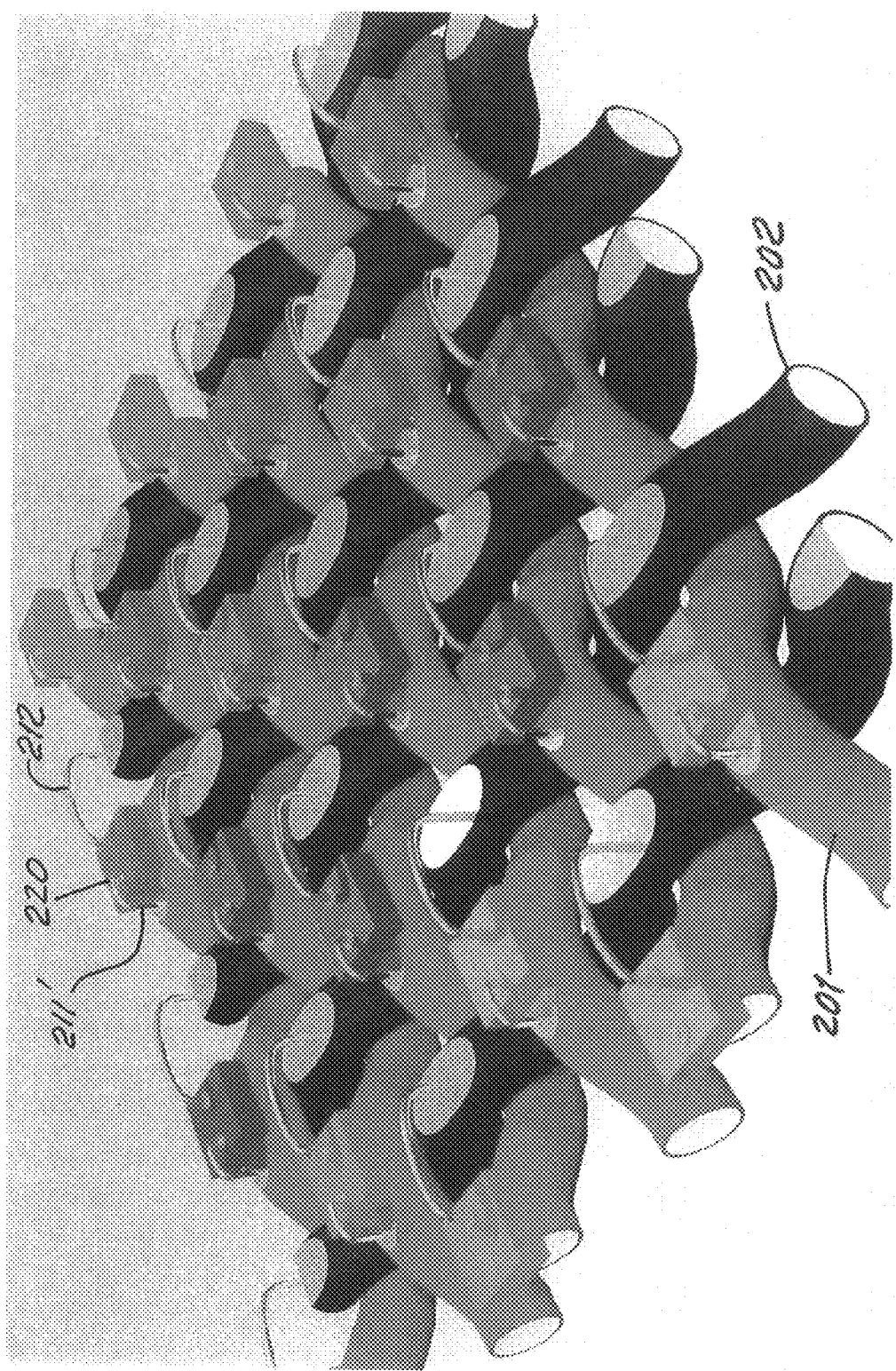

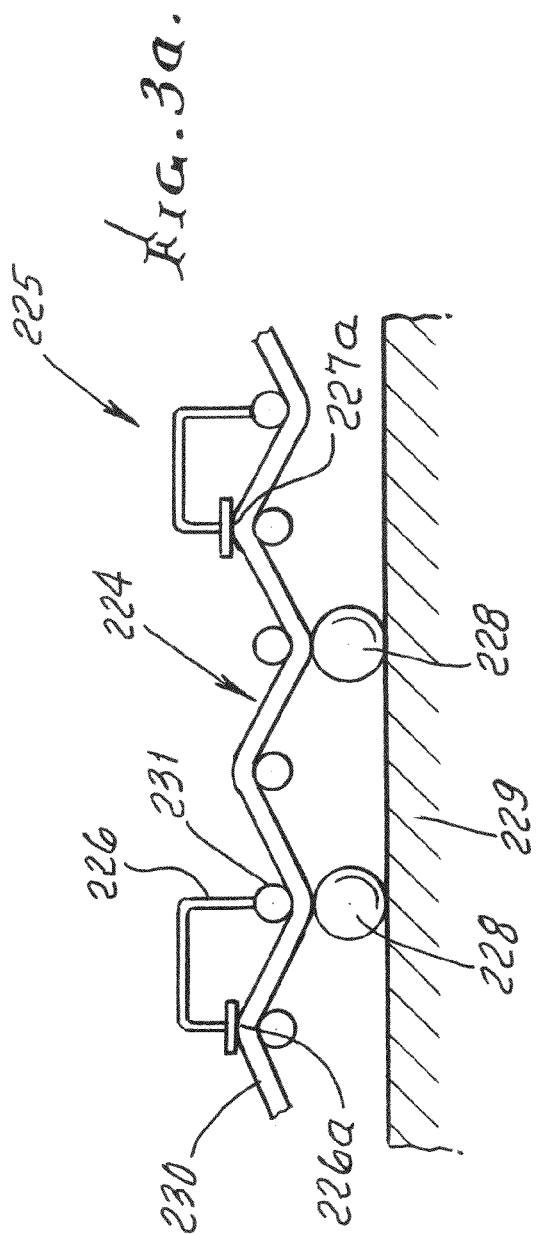
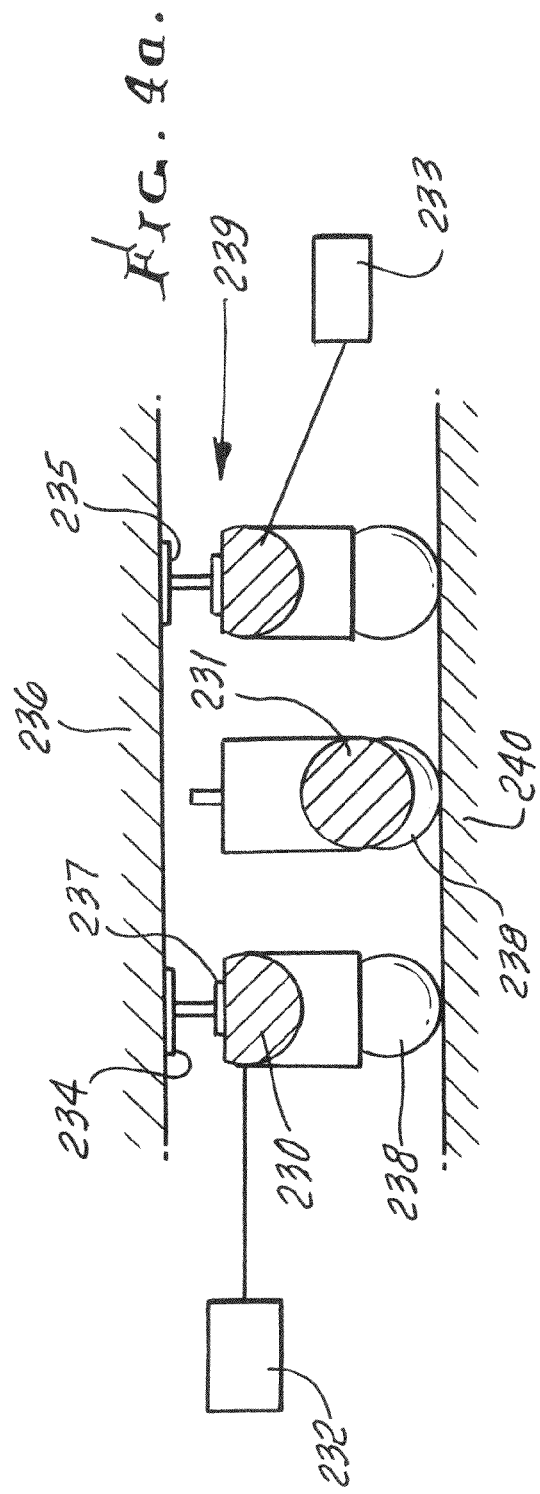

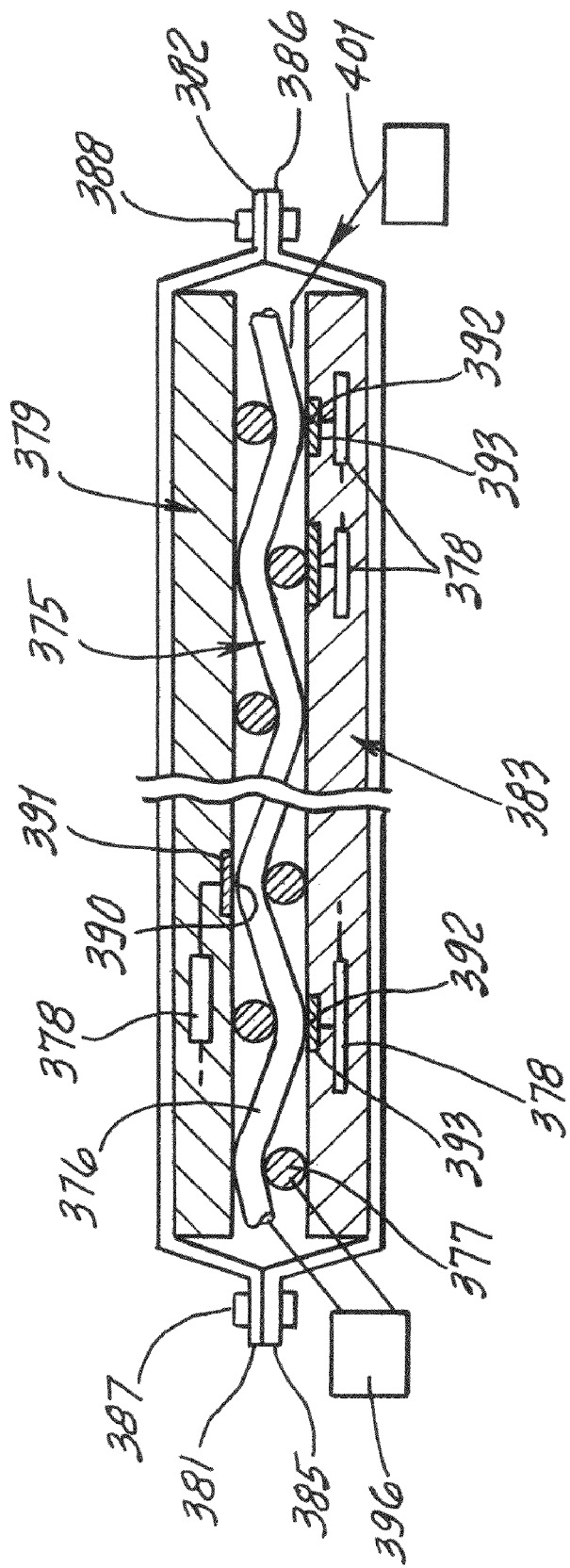

COMMUNICATION SYSTEMS INCORPORATING CONTROL MESHES

This application incorporates provisional applications 60/638,809 filed Dec. 23, 2004, 60/641,399 filed Jan. 5, 2005, 60/641,423 filed Jan. 5, 2005.

BACKGROUND OF THE INVENTION

This invention relates generally to communication, as for control purposes, between sites or regions provided as on a mesh of elongated elements, and a die or dies (devices) carrying electrical or optical circuitry. Such a mesh facilitates coolant flow through, and system cooling, particularly in compact structures.

There exists in industry great need for efficient, controllable optical communication as referred to. Prior communication methods and apparatus for control of die circuitry, lacked the many unusual advantages in structure, functioning and results as are herein provided.

SUMMARY OF THE INVENTION

It is a major object of the invention to provide efficient, simple and compact communication apparatus meeting the above need. Basically, the method communication with die or device circuitry, in accordance with the invention, includes:

a) providing a woven mesh having elongated conductive elements extending in array forming directions relative to said circuitry, b) establishing communication sites associated with the mesh elements, located in spaced apart relation, c) operating said sites via the mesh to communicate with said circuitry, as for example optically, or under pressure, the circuitry having detection capability.

As will be seen, the mesh typically has opposite sides, and at least one of such sides is typically positioned in site confronting relation to such a die, whereby light or other electromagnetic radiation controllably emitted at the site or sites efficiently communicates with the die circuitry, at great speed, as for escape via a detector or detectors. In this regard, certain of the elongated mesh elements may comprise optical fibers, and control of the emitting sites may be established from ends of the elements or fibers. Optical or other detection may be provided at the die or dies, in the path of site emission.

Another object includes locating LEDs at the sites, with orientation so that LED light is accurately communicated to the die circuitry as via detectors. Emission control of the LEDs may be in accordance with one or more of the following modes:

i) light from differentiated sites,
  ii) LED emitted light frequency,
  iii) LED emitted light duration,
  iv) LED emitted light phase.

A further object is to provide or establish light escape loci at the sites, and spaced along optical fibers that transmit light through the fibers, that define the elongated elements.

Apparatus to provide the above is also contemplated, and may include:

a) a woven mesh having elongated conductive elements extending in array forming directions relative to said circuitry, b) optical communications sites associated with the mesh elements, located in space apart relation, c) means for operating said sites via the mesh to communicate optically with said circuitry, having optical detection capability.

Clamping means may be provided for causing contact points on the circuitry unit to pressurally engage said sites.

Yet another object is to provide for coolant flow through the mesh, particularly when structure such as a die or dies is provided at opposite sides of the mesh, to define a coolant flow channel. Heat is efficiently transferred to the coolant from the elongated interwoven mesh elements which extend in different directions to define interstices between the warp and woof extending mesh elements.

Meshes may be composed of transparent radiation conductors in one or more axes to allow power and communication transport via radiation. Transparent radiation conductors (waveguides) in mesh form may be composed of glasses and/or polymers such as acrylics, silicones, fluoropolymers, polyphenylethers, and/or urethanes. The radiation conductors/waveguides/optical fibers may provide elastic and/or plastic mechanical compliance. Waveguides may be tubular and contain liquids and/or gels. Waveguides may have external coaxial and concentric layer/s (cladding) to increase internal reflection and/or to provide regions of radiation entry and escape. Waveguides and/or cladding regions can contain secondary emitters such as phosphors, dyes and/or semiconductor media including quantum dots as a means to change the frequency of the radiation entering and/or exiting the waveguide. Secondary emitter properties may be caused to vary from waveguide to waveguide and/or along the waveguide in a controllable fashion to allow a wide range of emitter and/or detector frequencies and thereby allow greatly increased communication rates and an increased ability to communicate with a specific emitting/detecting region on a die.

One embodiment consists of a woven X-Y grid of polymer optical fibers (waveguides) of right circular cylindrical section, with Light Emitting Diodes (LEDs) coupled to each end of each fiber. The LEDs can each act as both emitters and detectors. LEDs can emit pulses at high rates and act as detectors during off periods. The LEDs may emit a range of frequency spectrums and may be arranged such that the lowest frequency range emitter is at one end of a fiber array and the highest frequency range emitter is at the opposite end of the fiber array. The LEDs may communicate with an array of LEDs on a neighboring die that also act as both emitters and detectors.

LEDs have greatly reduced cyclic rates compared to LASERs, but LEDs are much less costly, are available in a wide range of frequencies from ultraviolet to long wave infrared, can act as detectors, can be very compact via "LASER LIFTOFF PROCESSING", and do not require close alignment with optical fibers. A large population of LEDs operating for example at 100 MHz each can yield very high overall communication rates.

LASERs allow much higher data rates and power density than LEDs. Arrays of "Vertical Cavity Surface Emitting LASERs" (VCSELs) may be coupled to both ends of optical fibers or connected to one end of optical fibers in an array and the other end of the fibers in the array may be connected to detectors. Fiber LASERs are also possible.

Radiation from LEDs or LASERs may be used to supply electrical power to the semiconductor circuits on die via photovoltaic conversion.

Optical fibers/waveguides may transport radiation to fibers and/or neighboring elements via evanescent wave coupling.

Radiation pulses from semiconductor emitters (LASERs/LEDs) can be used to control the cyclic rates of electronic circuits. Circuits may be made to operate at a variety of rates or may be synchronized, if desired.

Radiation entry/or exit from the waveguides to and/or from emitters and/or detectors and/or optical switching or control elements on the die may be via scattering regions within and/or on the surface of the waveguide and/or via depressions/deformations in the waveguide and/or as a consequence of the convolutions involved in weaving.

Radiation entry and/or exit from the ends of the waveguide may be via coupling to semiconductor radiation detectors and/or semiconductor radiation emitters such as LASERs and LEDs. Configurations include optical input to the die and electronic output and optical input and optical output.

Heat transport fluids may also act as optical fluids. Candidate fluids may be chosen for properties of interest in optical systems such as transparency and refractive index and may contain additives including phosphors, fluorophores, dyes, liquid crystals, semiconductor media including quantum dots, and/or scattering agents.

These and other objects and advantages of the invention, as well as the details of an illustrative embodiment, will be more fully understood from the following specification and drawings, in which:

DRAWING DESCRIPTION

The patent or application file contains at least one drawing executed in color. Copies of this patent or patent application publication with color drawing(s) will be provided by the Office upon request and payment of the necessary fee.

FIG. 2 is like FIG. 1, but shows an insulative substrate LED array on or at one face of a wire mesh grid array;

FIG. 3a is a schematic showing of the FIG. 3 assembly;

FIG. 4a is a schematic showing of the elements of FIG. 4;

Figure 17:
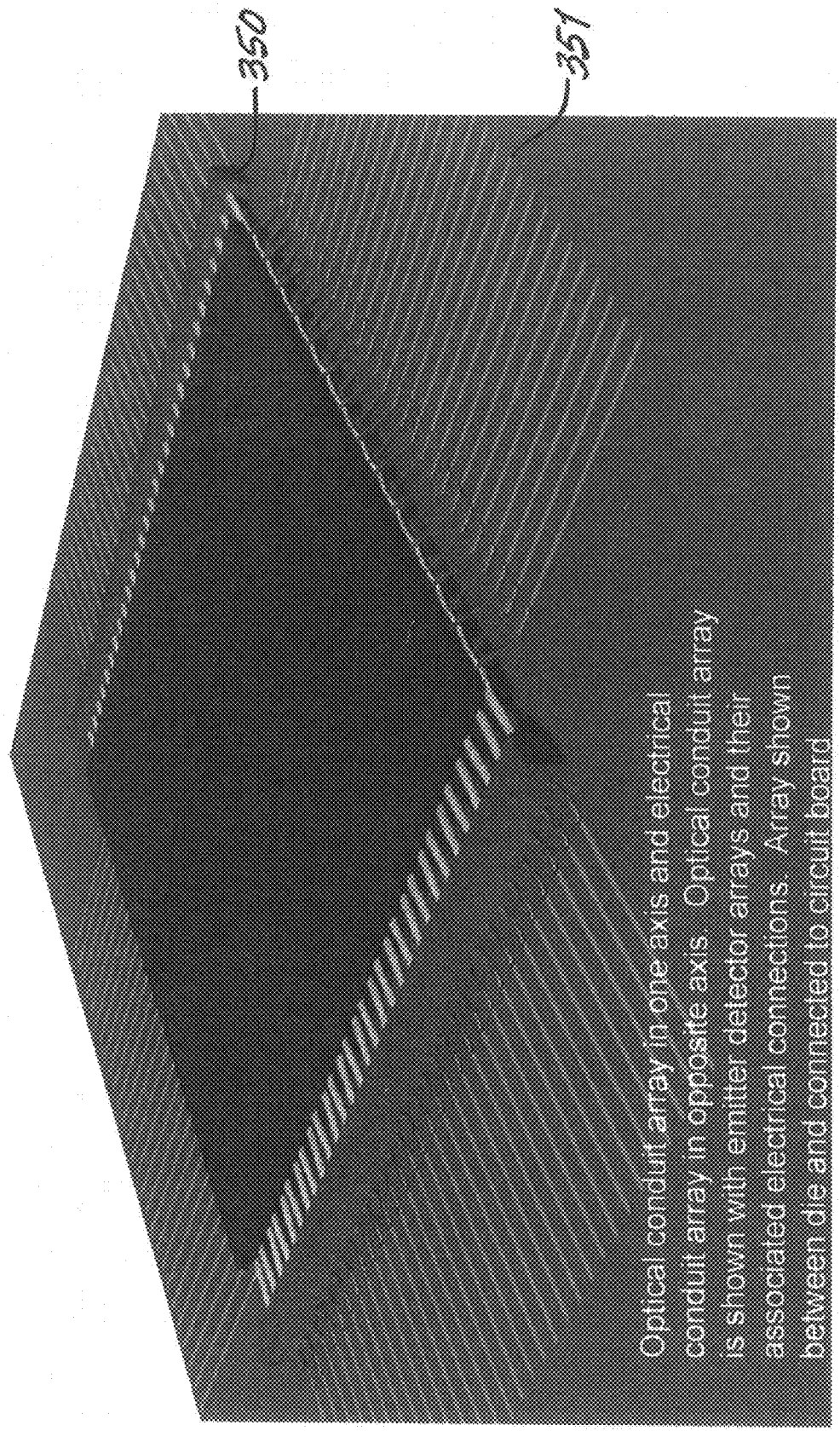
Figure 18:
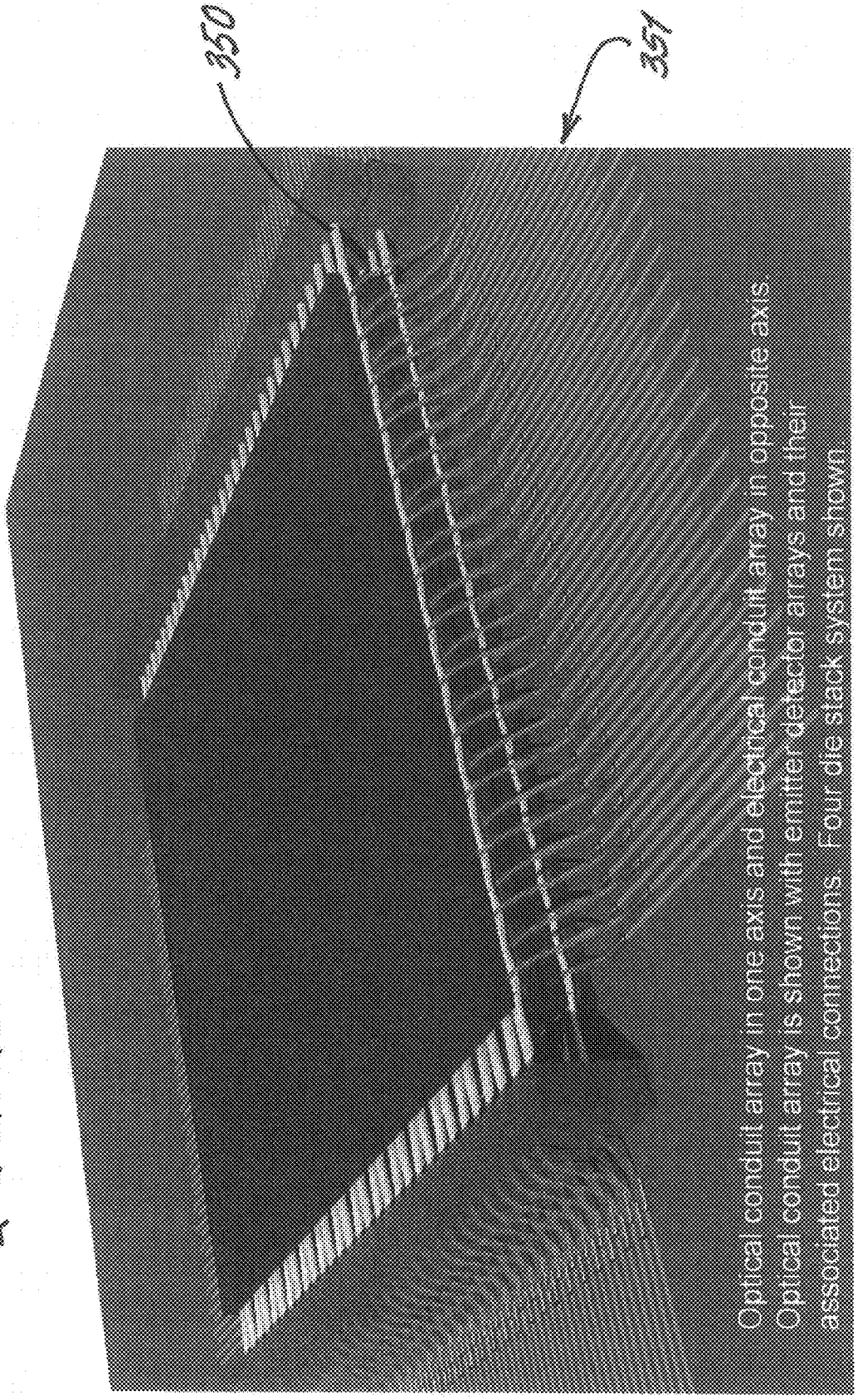
Figure 19:
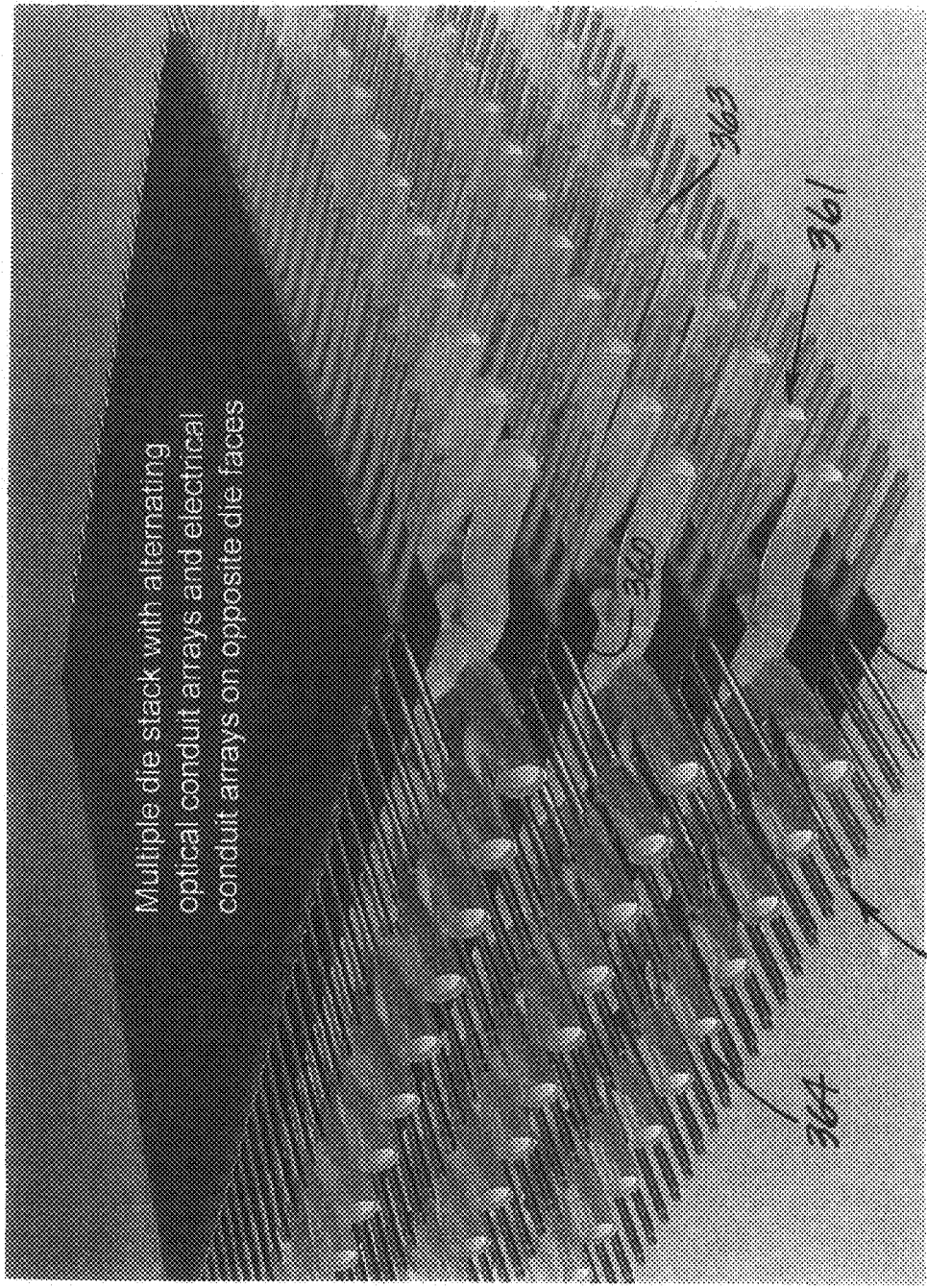

FIG. 17 shows an optical conduit array in one axis and electrical conduit array in opposite axis. Optical conduit array is shown with emitter detector arrays and their associated electrical connections. The array is shown between die and connected to circuit board;

FIG. 18 shows an optical conduit array in one axis and electrical conduit array in opposite axis. The optical conduit array is shown with emitter detector arrays and their associated electrical connections. A four die stack system is shown;

FIG. 19 shows a multiple die stack, with alternating optical conduit arrays and electrical conduit arrays, on opposite die faces; and FIG. 20 shows use of a conductive mesh in a pressurized assembly, with integrated circuits.

DETAILED DESCRIPTION

Figure 1:
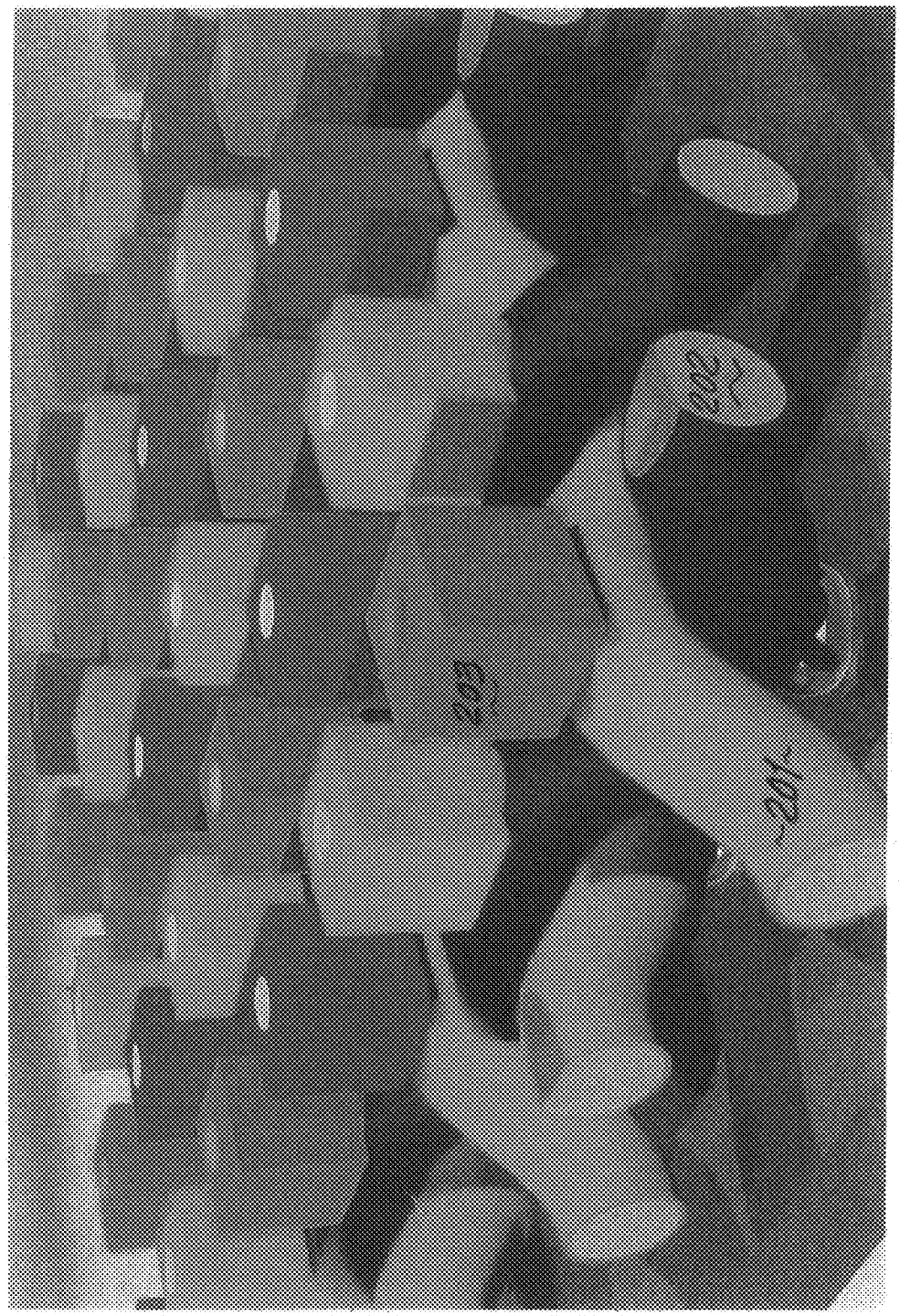
FIG. 1 is a perspective view showing of an assembly including a wire mesh grid array, with a conductive substrate LED array at one face of the mesh array, and attached to or proximate a circuit device or die at the opposite face of the mesh array, with ball grid array.
Figure 1A:
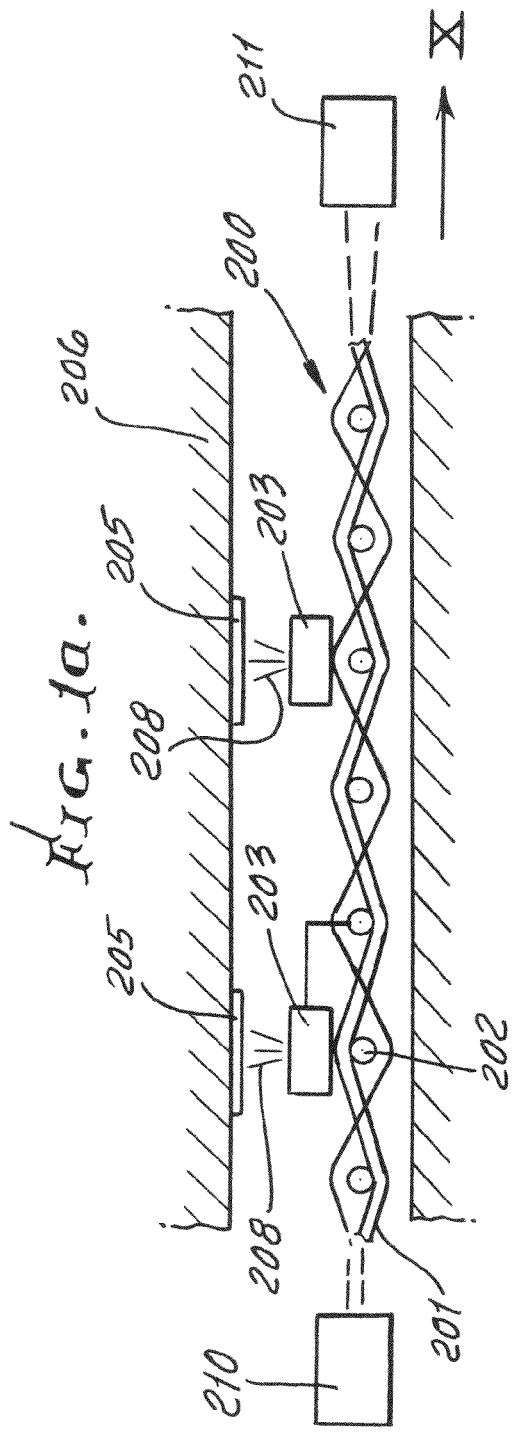
FIG. 1a is a schematic showing of the FIG. 1 assembly.

Referring first to FIGS. 1 and 1a, a wire mesh 200 includes warp and woof interwoven wires 201 and 202, one or both of which may be electrically conductive. Circuitry 210 and 211 connected to the wires selectively controls energization of LEDs 203. The latter are shown as mounted or supported on wires 201, and others may also be supported on wires 202 to provide an array of LEDs, in X and Y directions, which may be substantially perpendicular. Each LED is electrically connected, as at 203 and 204 to two wires 201 and 202, so that when both such wires 201 and 202 are controllably and electrically energized, that selected LED is energized to emit light or light pulses, as in a beam 208, toward a detector 205 on a circuit device (die) 206 overlying the mesh. In that way, the selective control of the energization of wires 201 and 202 selectively controls (including optically) the detectors 205 on device 206, i.e. effectively controls operation of device 206, and the control may be frequency or duration controlled, as well as array location (spacial) controlled to selectively control detectors spaced apart on the die. Those detectors are associated with circuitry in or on the die.

Figure 2A:
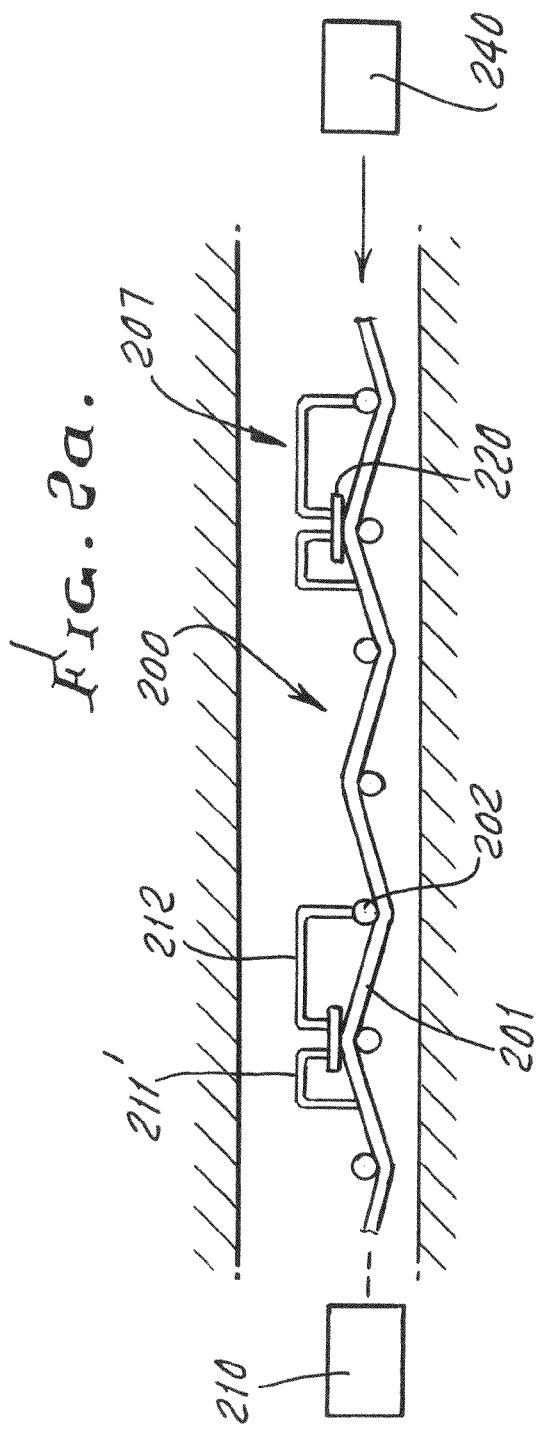
FIG. 2a is a schematic showing of the FIG. 2 assembly.

FIGS. 2 and 2a are like FIGS. 1 and 1a except that an insulative substrate LED array 207 is shown on the wire mesh grid 200 having interwoven warp and woof wires 201 and 202. The LEDs 220 have less height than those shown in FIG. 1, and are connected to the wires 201 and 202. See insulated connectors 211' and 212. The LEDs are mounted on wires 201 as shown, and are selectively and controllably energized as described above in FIGS. 1 and 1a. They may controllably emit light or light pulses, in beams, as described, for detection by die circuit elements 205.

Figure 3:
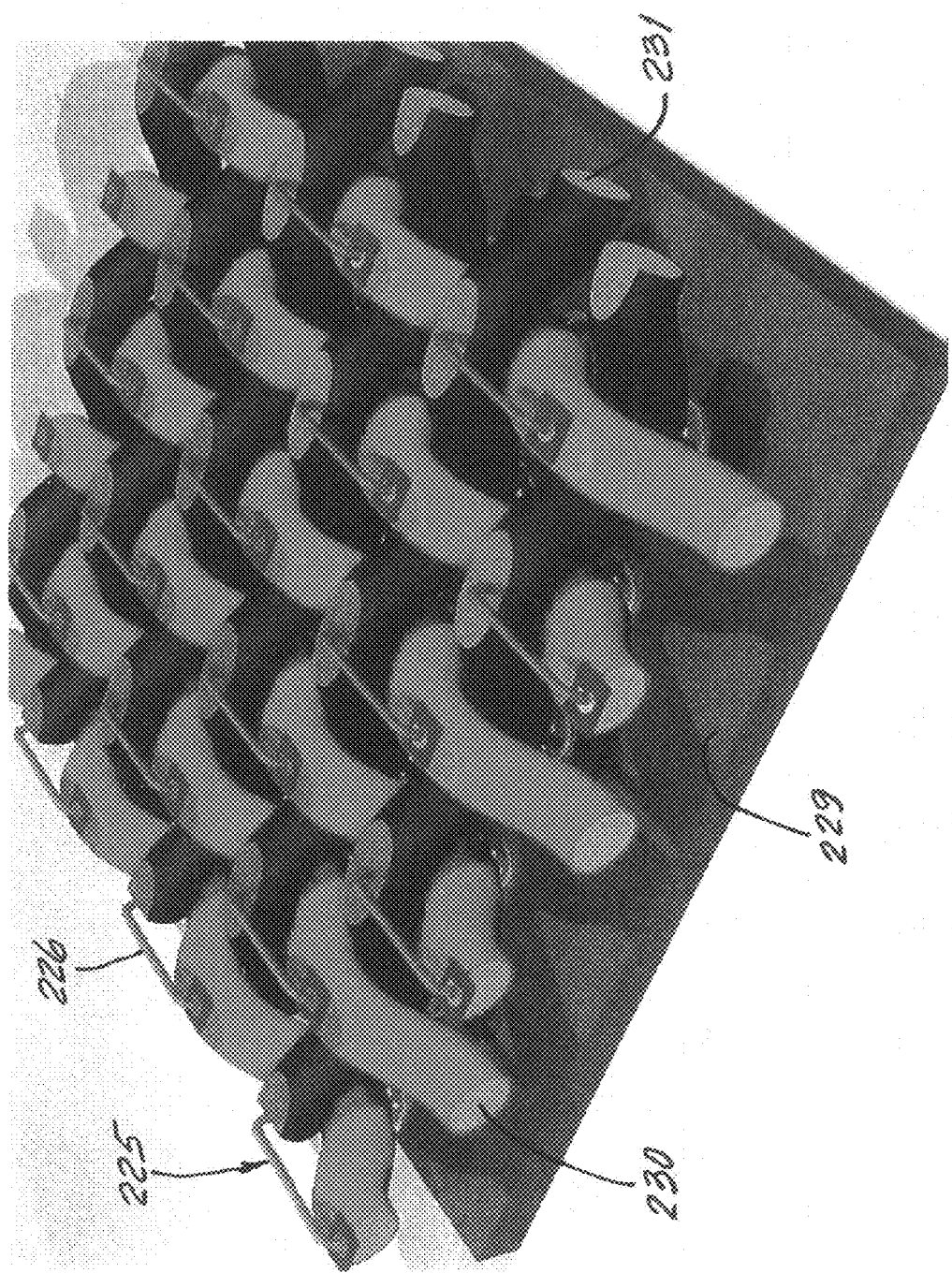
FIG. 3 is like FIG. 2, but shows a conductive substrate laser lift-off LED array on one face with wire bonding to row conductors.

FIG. 3 similar to FIG. 2, shows in FIG. 3a a conductive substrate LED array 225, in the form of "LASER" lift-off array of LEDs 229, and characterized by wire bonding to row conductors, as at bond locations 226. Bonding site flats on the wires appear at 226a and 227a. Balls 228 are located between the wire mesh 224 and a circuit device 229 underlying the mesh. Each LED is connected to a warp wire 230 and a woof wire 231, of the mesh.

The mesh wires may each comprise inner and outer conductors, which may extend concentrically.

Figure 4:
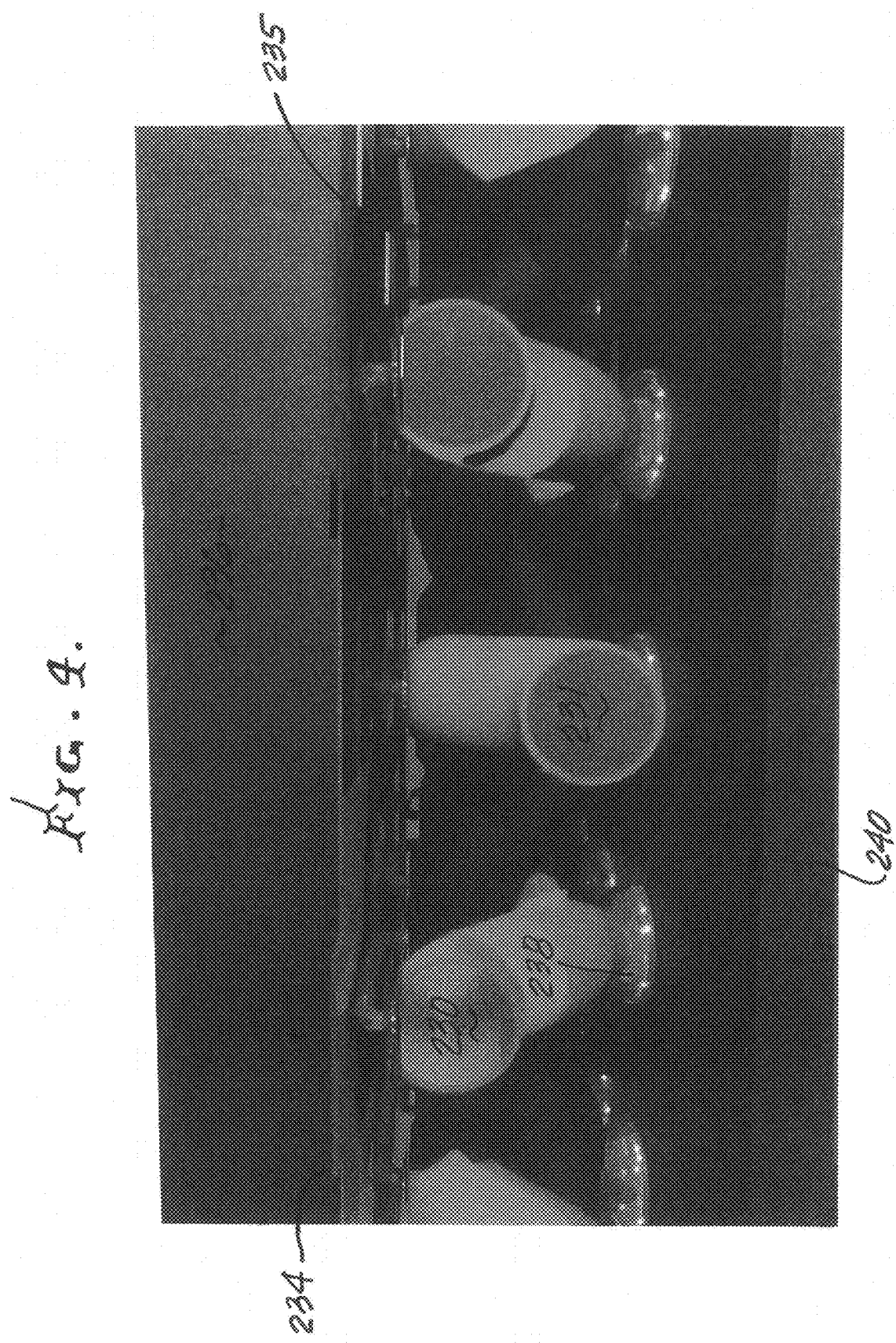
FIG. 4 is a section view of a wire mesh array with an LED array communicating optically with a detector array on a neighboring die face.

FIGS. 4 and 4a show in section mesh wires 230 and 231. Electrical power is supplied as at 232 and 233 to ends of wires 230, for supply to circuitry paths of 234 and 235 on a circuit device 236. Paths 234 and 235 may comprise gold (or other conductive metal) plating or coating defining circuit paths. LEDs 237 are in the communication paths between 230, and 234 and 235. Balls 238 support the wire mesh 239, above a die or other structure 240.

In each of the above, the mesh provides interstices through which coolant such as air may flow, through, and parallel to the plane of the mesh, thereby cooling the LEDs or wires. Means to effect such air flow is shown, for example in FIG. 2a, at 240.

Figure 5:
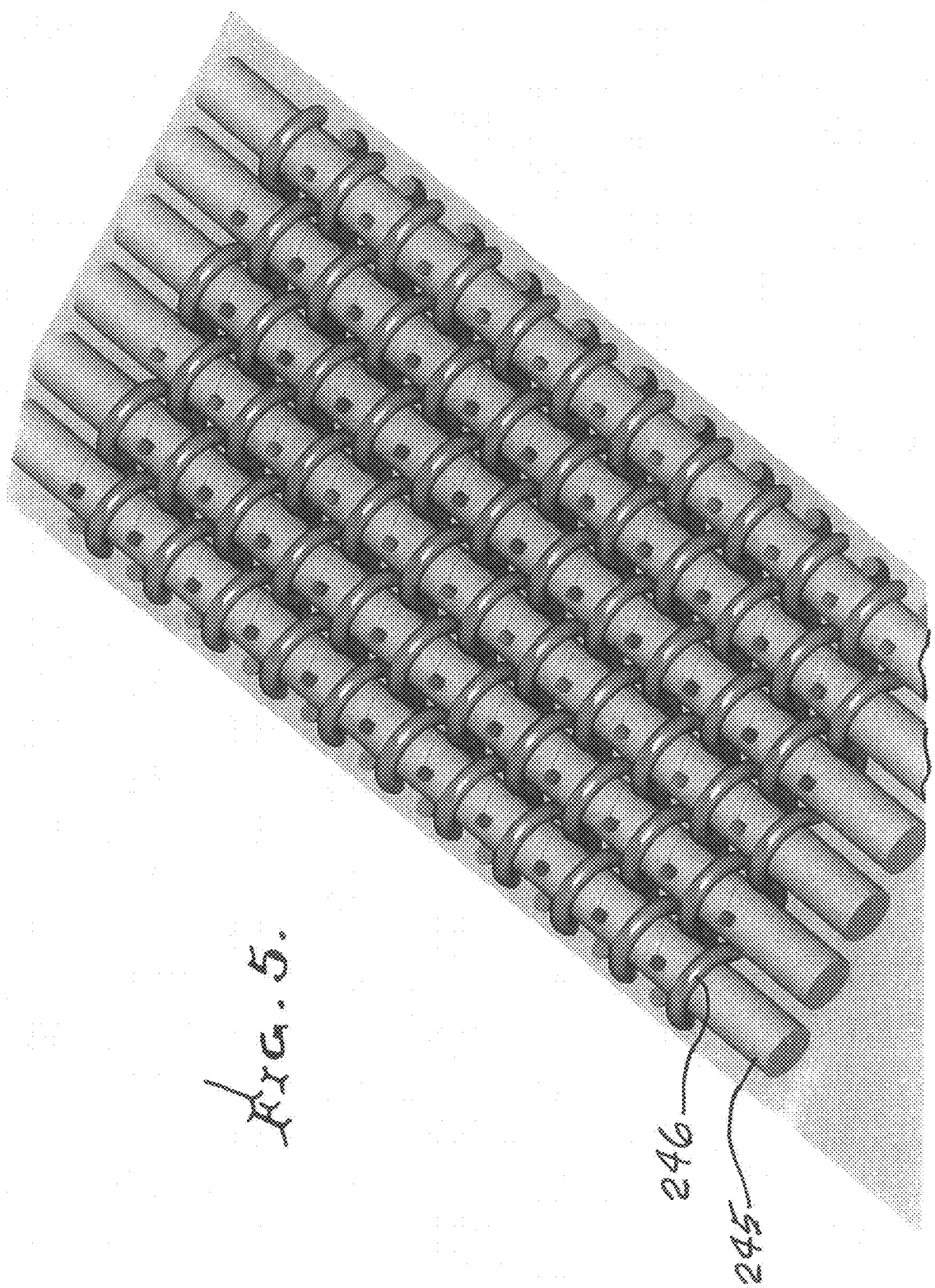
FIG. 5 shows wires in a Dutch weave pattern with conductive substrate LED array.

FIG. 5 shows wires 245 and 246 in a usable Dutch weave mesh pattern. A conductive substrate LED pattern is also shown, associated with the wires. See LEDs 247 carried by 245, and which may be electrically connected to the wires in any of the above described ways.

Figure 6:
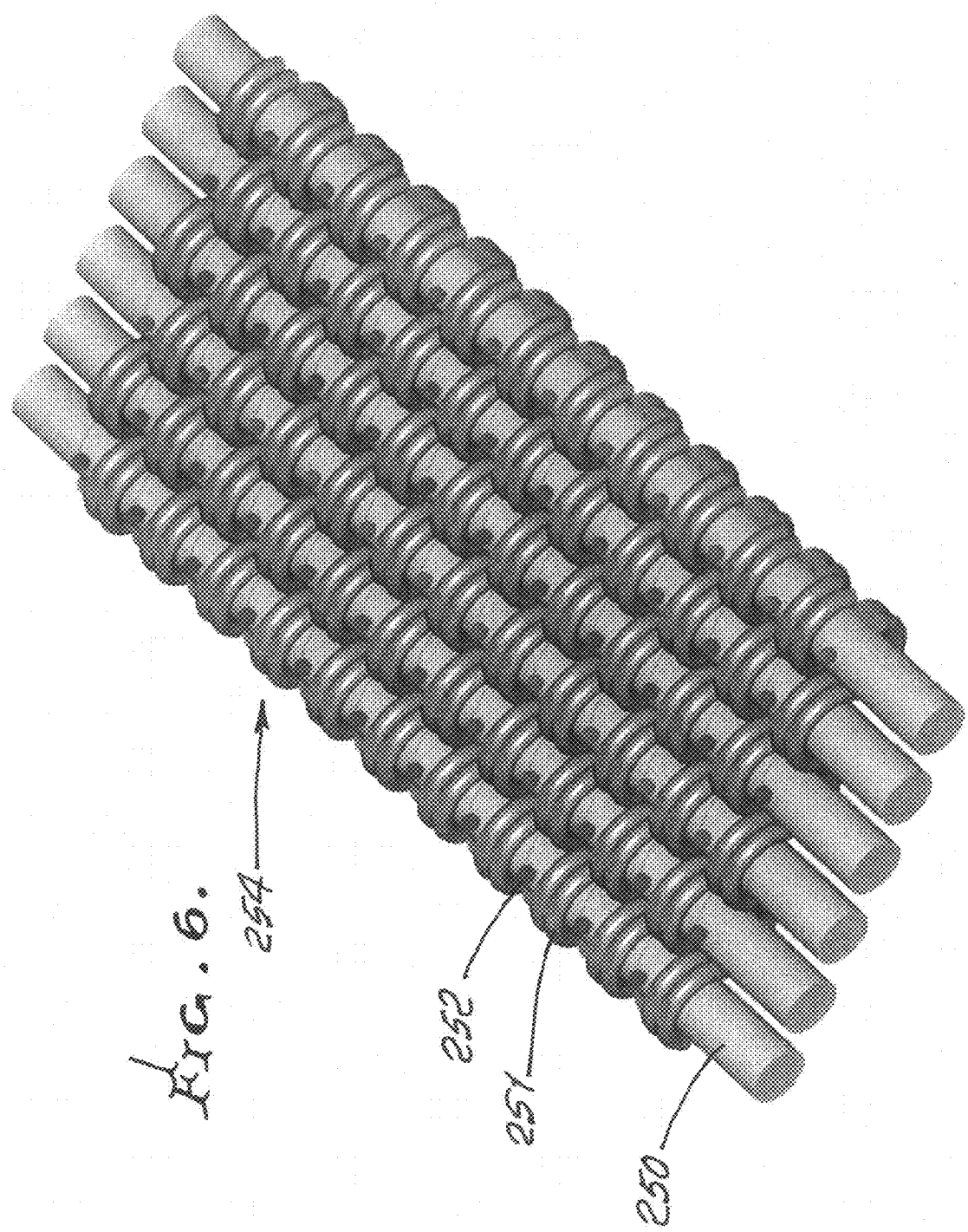
FIG. 6 shows a double Dutch weave mesh pattern, with a conductive substrate LED array.

FIG. 6 shows a usable double Dutch weave mesh pattern 254 of woven wires 250 and 251. A conductive substrate array of LEDs 252 is also shown.

Figure 7:
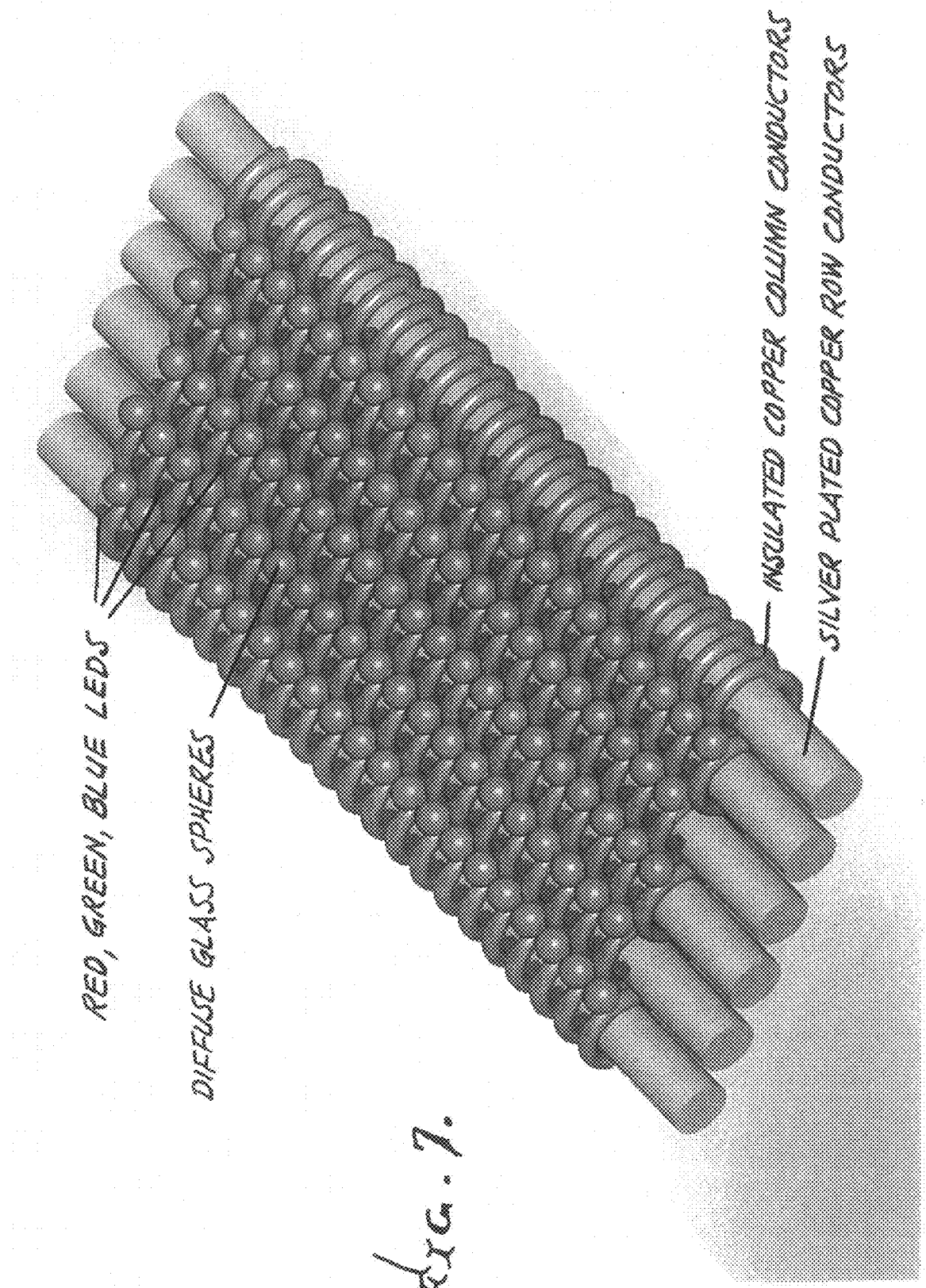
FIG. 7 shows a double Dutch weave mesh pattern, with an associated conductive substrate LED array, and with diffuse glass spheres that scatter radiation from the LEDs and provide physical protection.

FIG. 7 shows a double Dutch wave mesh pattern 260, of woven wires 261 and 262. A conductive substrate array of LEDs 264 is also shown. Diffusely separated glass spheres 265 are closely associated with the LED array, and may nest in the mesh at the LED side thereof, to scatter radiation from the LEDs, and also to provide physical protection.

Figure 8:
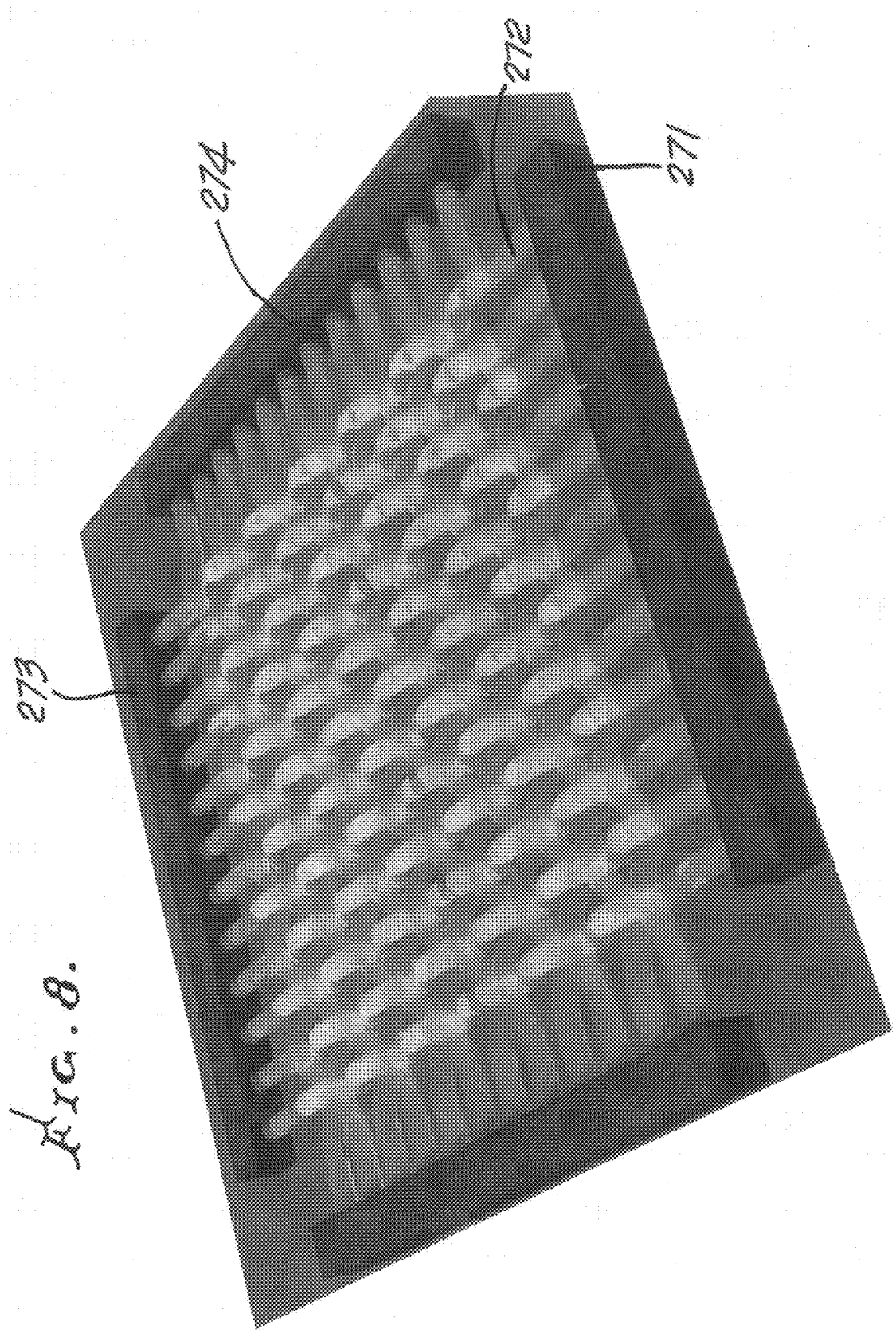
FIG. 8 shows a biaxial optical fiber array, with fiber ends connected to semiconductor emitters and/or detector arrays.

FIG. 8 shows a biaxial optical fiber mesh array 270 with fiber ends connected to semi-conductor emitters and/or detector arrays in a housing or housings. See for example housing 271 containing an emitter array and connected to ends of optical fibers 272; housing 273 containing a detector array connected to the opposite ends of optical fibers 272; housing 274 contains an emitter array and connected to ends of optical fibers 275; and housing 276 containing a detector array connected to the opposite ends of optical fibers 275. The emitters may be LEDs, for light traveling in the mesh fibers where two X and Y direction fibers overlap, a bright liquid scattering zone 276 is established when such two fibers are simultaneously energized, such scattering being detectable. In this regard, light is or may be emitted at bands along the optical fibers.

Figure 9:
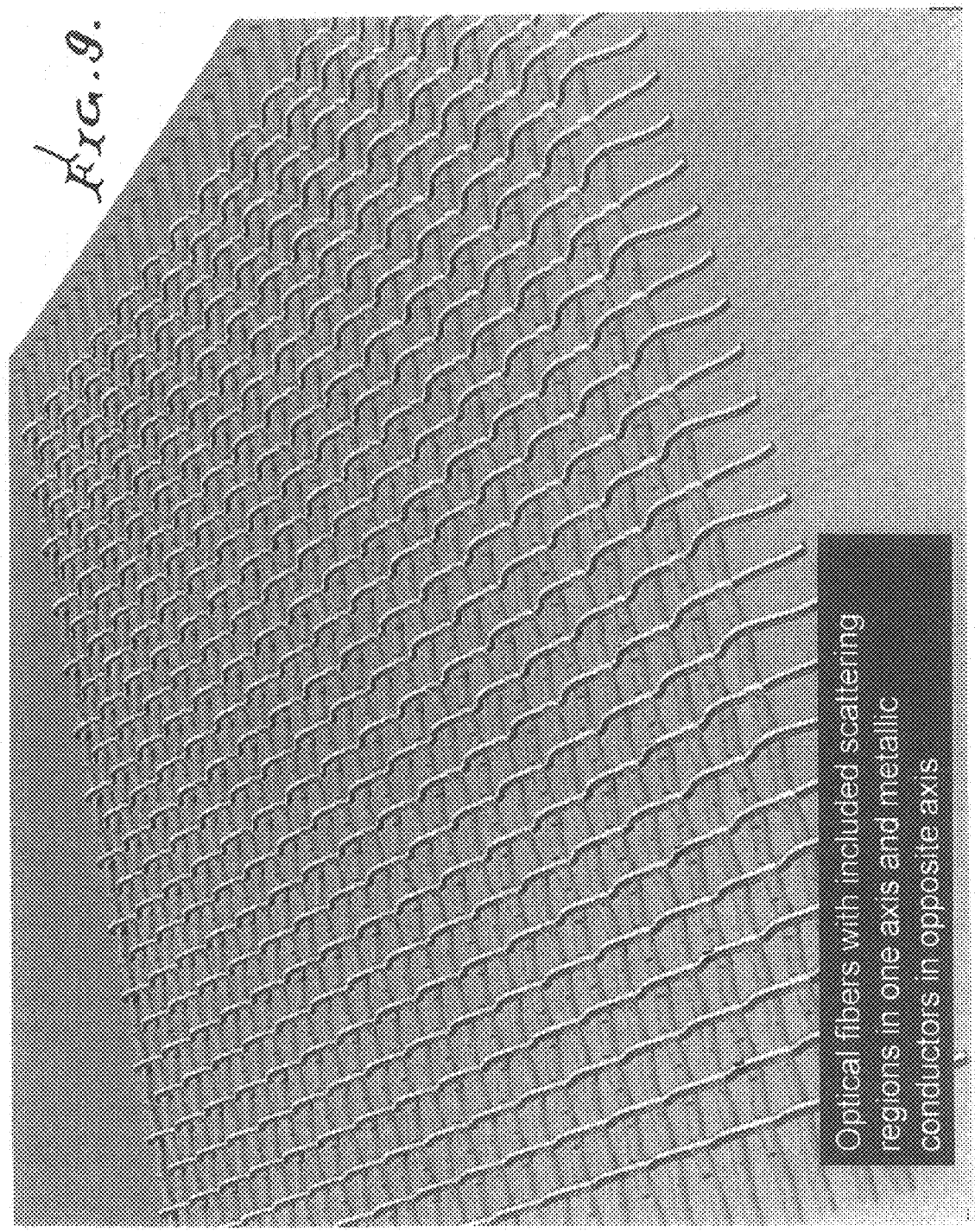
FIG. 9 shows a mesh of optical fibers, with included scattering regions in one axis and metallic conductors in opposite axis.

FIG. 9 shows a mesh 280 including optical fibers 281 with included light scattering regions 282 along one axis, the length axes of certain (warp) fibers 281. The mesh includes elongated (woof) conductors 283 interwoven with 281, and cooperating therewith to provide selective energization of regions 282.

Figure 10:
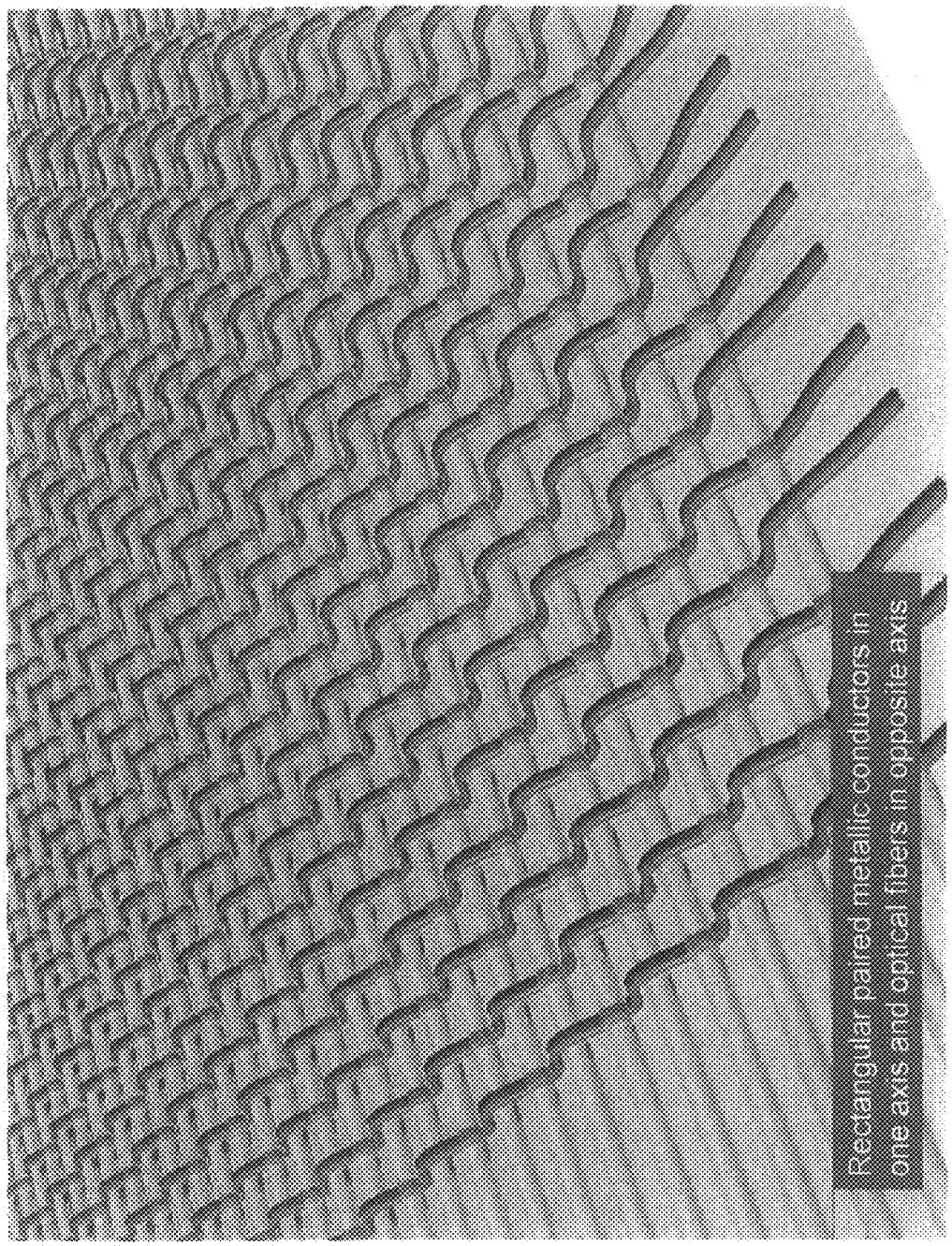
FIG. 10 shows a mesh with rectangular paired metallic conductors in one axis and optical fibers in an opposite axis.

FIG. 10 shows a mesh 290 with rectangular cross-section, paired metallic conductors 291 extending lengthwise and along one axis, the conductors 291 woven with optical fibers 292 extending along another axis (for example the two axes being at 90° relation.

Figure 11:
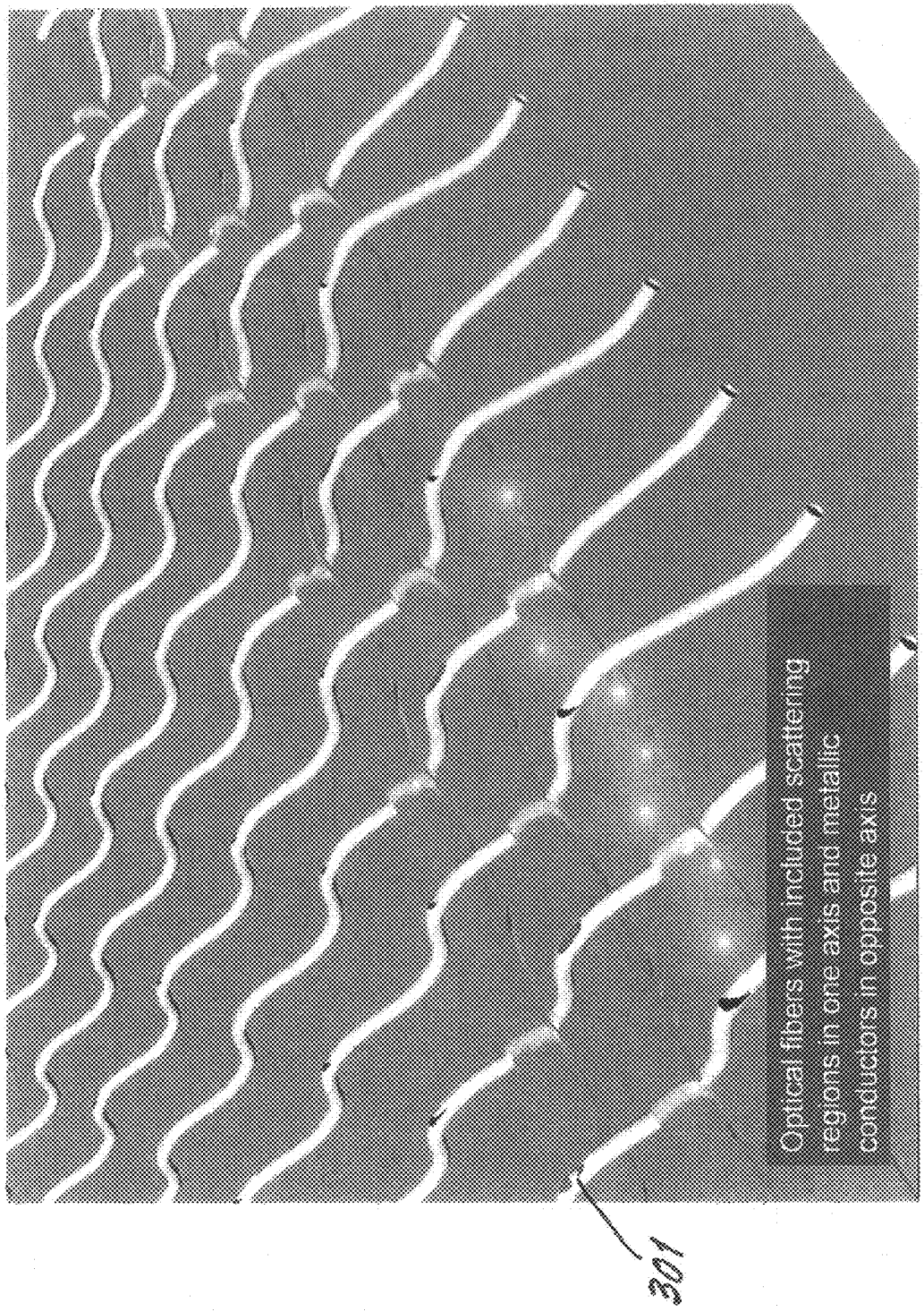
FIG. 11 shows a mesh having optical fibers, with included scattering regions in one axis and metallic conductors in opposite axis.

FIG. 11 shows a mesh 300 with optical fibers 301 extending in or along one axis, and metallic conductors 302 extending in or along another axis extending generally normal to the axis. Light emission and scattering regions 303 are spaced along light conducting fibers 301. Conductors 302 provide mesh reinforcement, and are woven with fibers 301.

Figure 12:
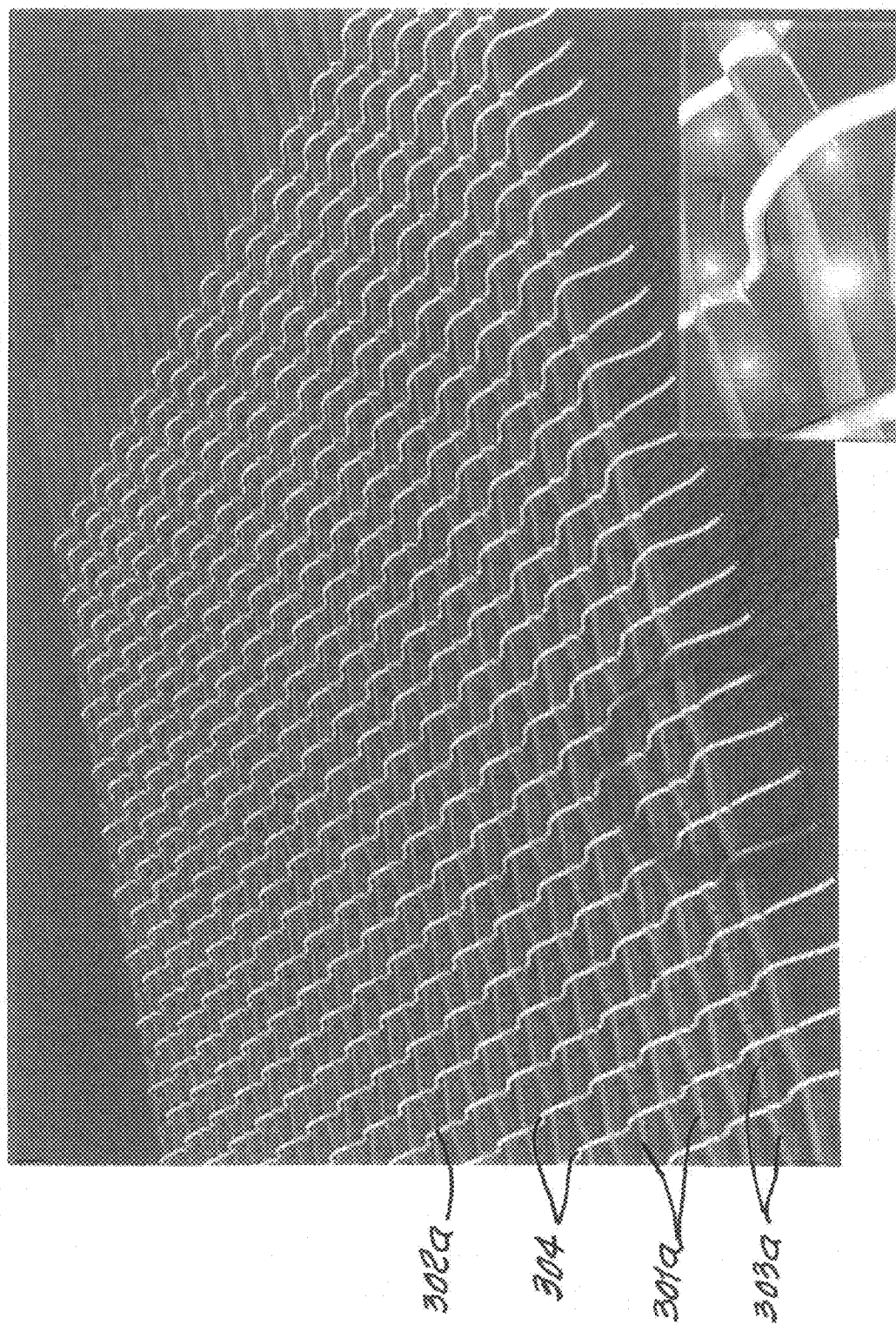
FIG. 12 is like FIG. 11, and shows optical fibers with included scattering regions in one axis and metallic conductors in opposite axis.

FIG. 12 is like FIG. 11, but the metallic conductors 302a extend everywhere over the optical fibers 301a. Conductors 302a are generally sinusoidal, and are attached at 304 to the fibers 301a. Light emission and scattering regions 303a are spaced along fibers 301a.

Figure 13:
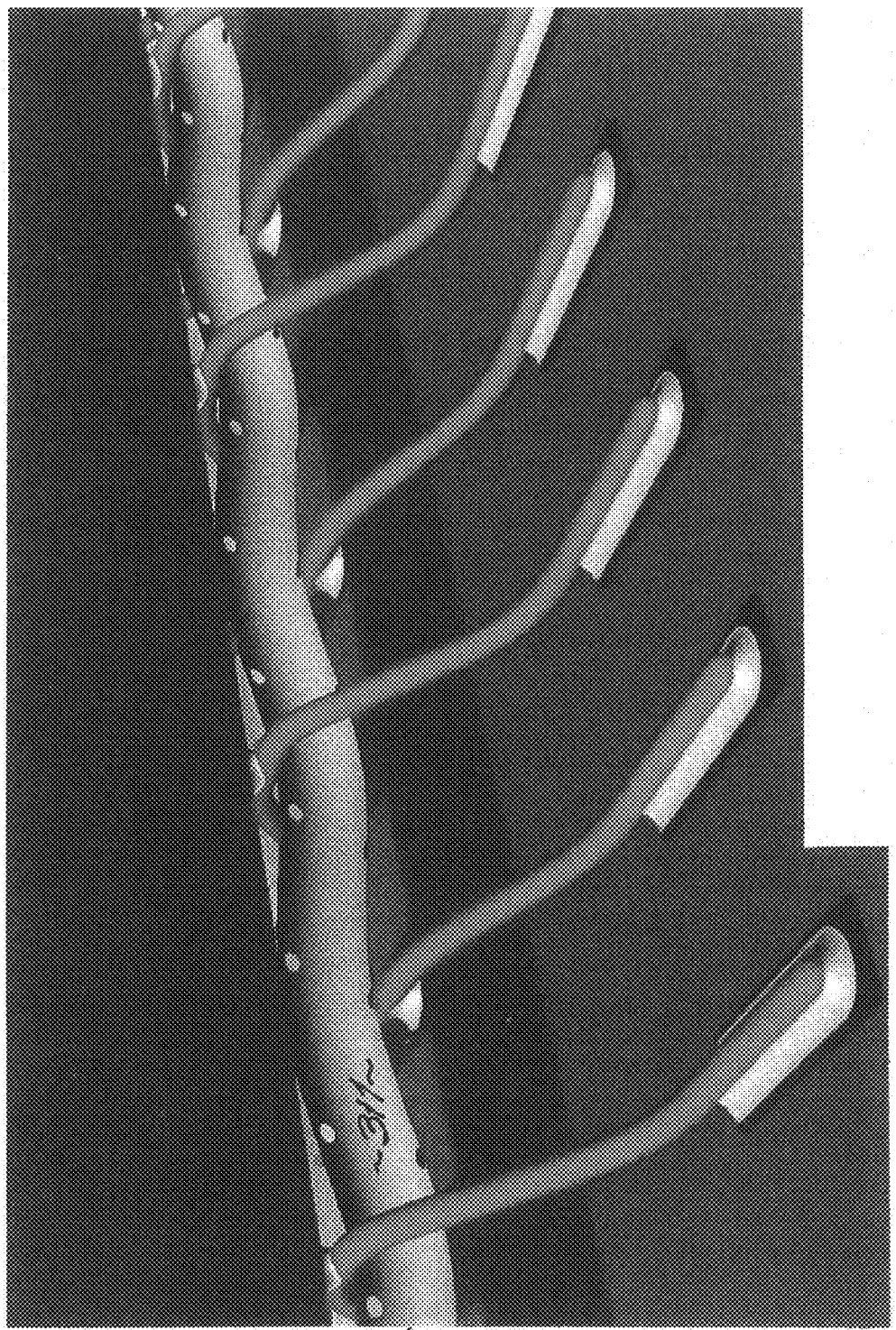
FIG. 13 shows optical fibers with included surface scattering regions along helical coordinates, and metallic conductors in opposite axis soldered to pads on a circuit board. The array is sandwiched between a die and electrically connected to die pads as via solder.

FIG. 13 shows an array 310 of mesh interwoven optical fibers 311, and metallic conductors. The array is sandwiched between dies (circuit devices) and electrically connected to die conductive pads, via solder. The optical fibers have light scattering surface regions, along helical coordinates about the fibers.

Figure 14:
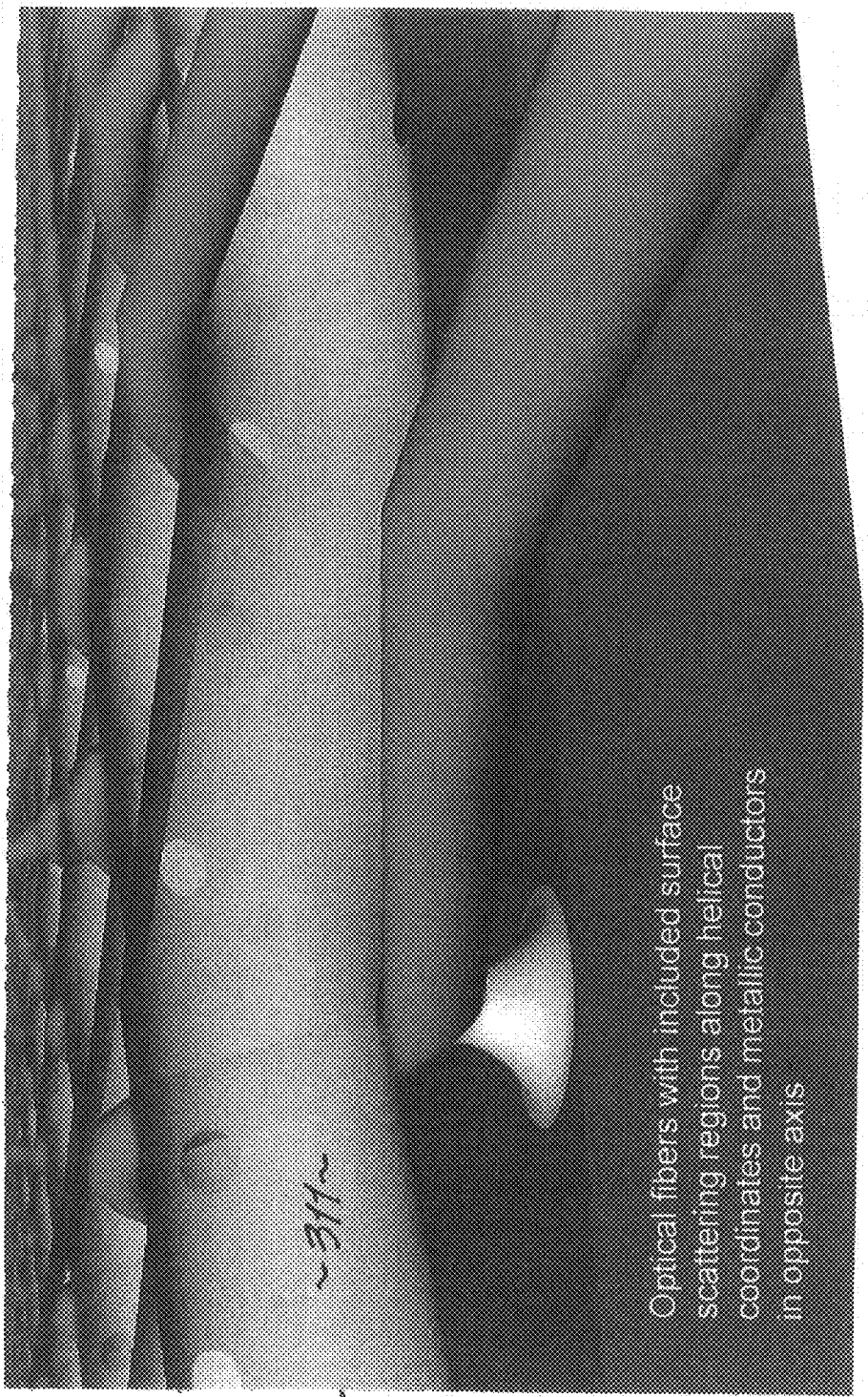
FIG. 14 is like FIG. 13, and shows optical fibers with included surface scattering regions along helical coordinates and metallic conductors in opposite axis.

FIG. 14 is like FIG. 13.

Figure 15:
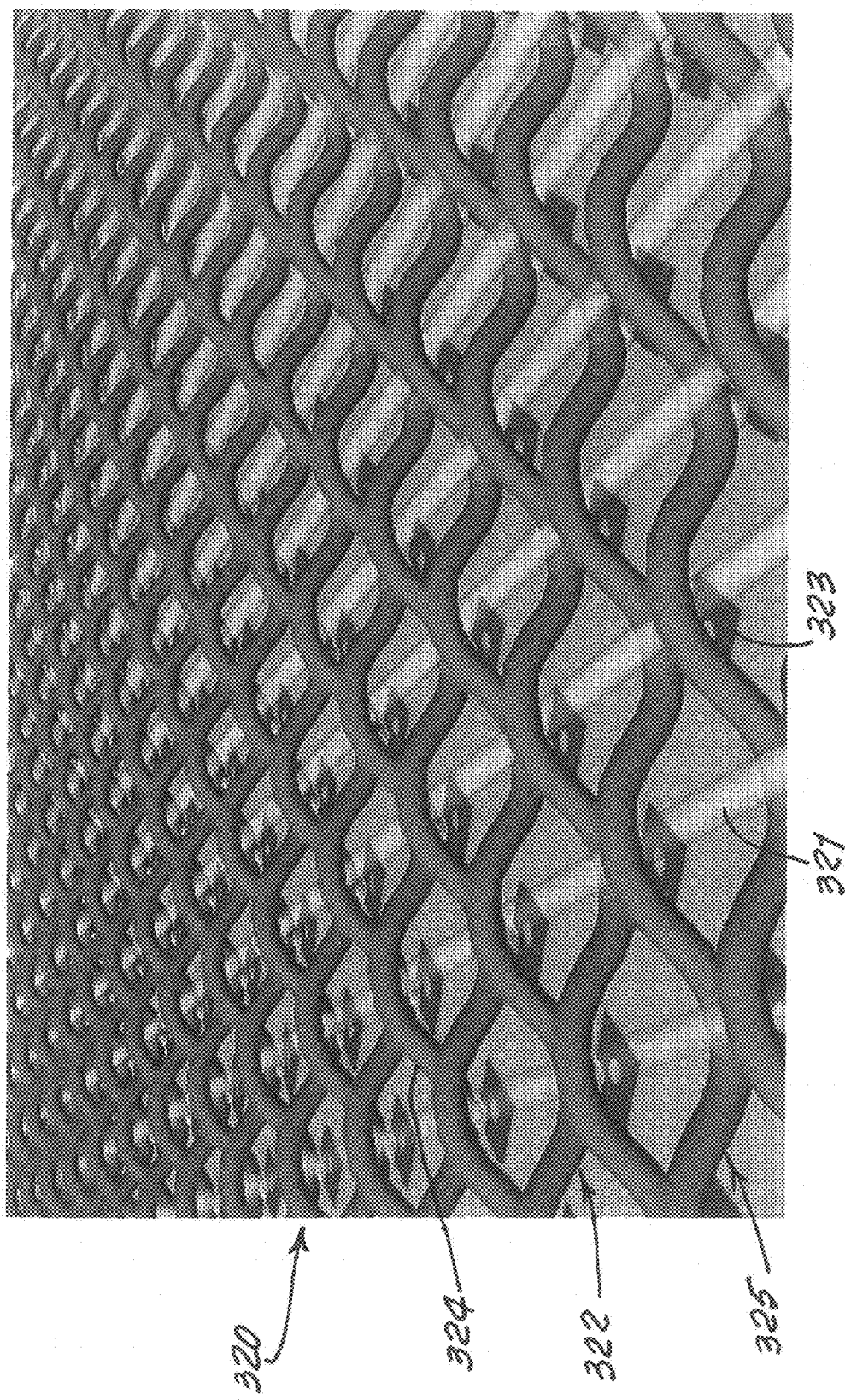
FIG. 15 shows an optoelectronic grid with optical fibers in one axis communicating with light emitting diode (LED) array on die acting as emitters and detectors.

FIG. 15 shows an optoelectric grid 320, with optical fibers 321 extending in one axial direction, and communicating with a light emitting diode (LED) array 322 forming a mesh weave with 321. Light emitting diodes appear at 323, on grid wires 321. The grid is on a die 325.

Figure 16:
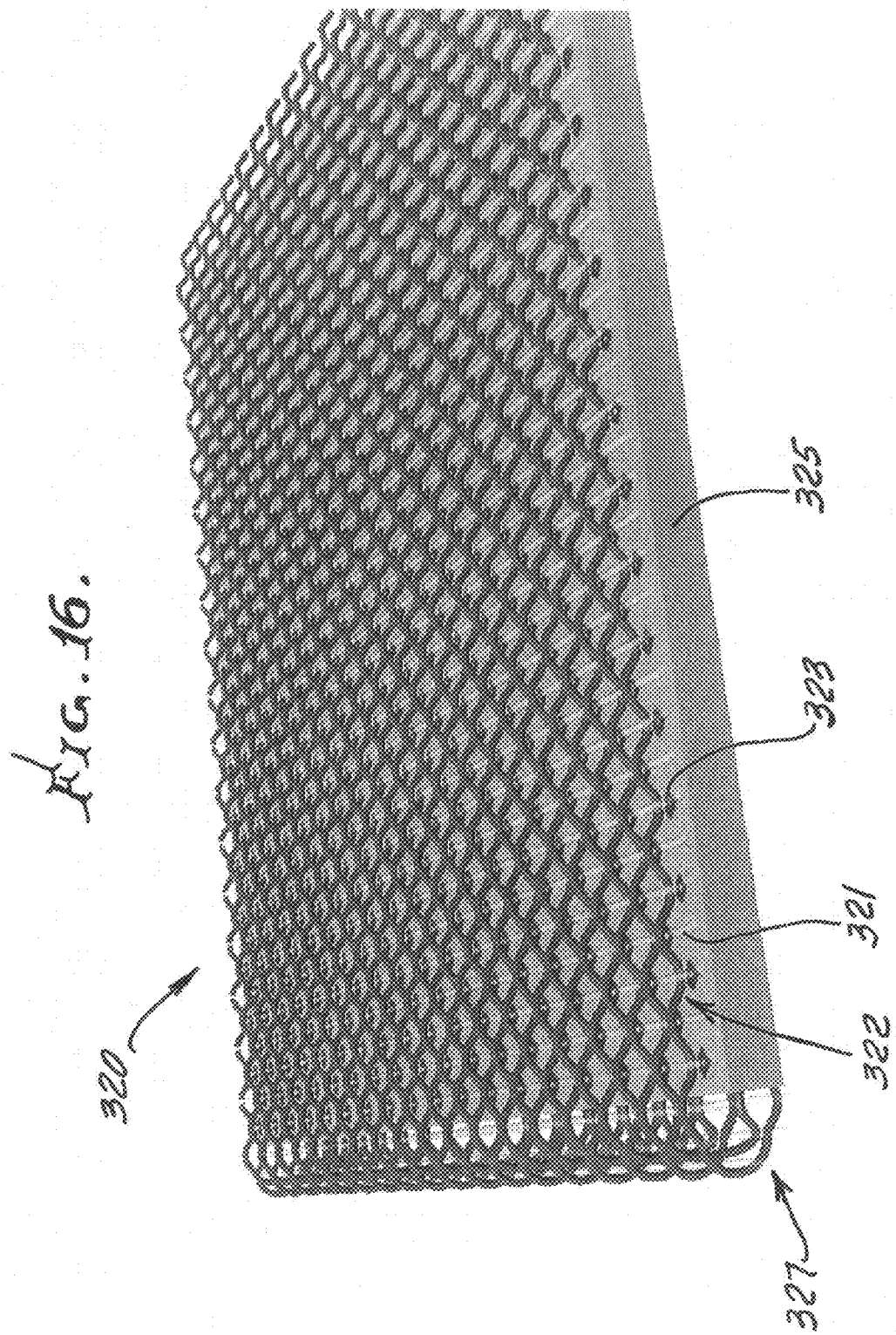
FIG. 16 shows an optoelectronic grid with optical fibers in one axis communicating with light emitting diode (LED) array on die acting as emitters and detectors.

FIG. 16 is like FIG. 15 and has the same elements. Control wires 327 appear at an end of the grid.

Embodiments as described are operable to communicate with circuitry having optical detection capability by:

a) providing a woven mesh having elongated conductive elements extending in array forming directions relative to said circuitry, b) establishing optical communication sites associated with the mesh elements, located in space apart relation, c) operating said sites via the mesh to communicate optically with said circuitry, having optical detection capability.

In FIG. 17 an optional conduit array 350 extends along one axis, and an electrical conduit array 351 extends along another axis, as at 90° relative to the one axis. Array 350 includes emitter detector arrays and their associated connection. The arrays are sandwiched between dies and are connected to an associated circuit board, and may be meshed.

FIG. 18 is like FIG. 17, and shows an optical conduit array or arrays 350 that extend along one axis; and an electrical conduit array or arrays 351 extending along another axis. Array 350 includes an emitter detector array or arrays, and their associated electrical connections. A four die stack system is shown, and may be meshed.

FIG. 19 shows a multiple die 360 stack. Alternating optical conduit arrays 361, and electrical conduit arrays 362 are provided at opposite die faces, i.e. at opposite sides of the dies 362. Arrays 361 may include meshes of optical fibers 363 interwoven with optical fibers 364.

Woven wire meshes are available in a wide range of materials, mesh sizes and weave styles. Copper wire cloth is a low cost commodity material with 3× the thermal conductivity of silicon and it is amenable to an wide range of manufacturing processes, including annealing, bending, blanking, brazing, coining, electric discharge machining, etching, insert molding, milling, plating, punching, rolling, shearing, soldering, stamping, tempering, and welding.

Woven meshes can act as mechanically/structurally compliant layers between materials with widely differing thermal expansion coefficients. This is an enormous benefit as thermomechanical failure is the dominant failure mechanism in microelectronics.

The woven meshes of the present invention allow a variety of continuous or multiplexed electrical contact and communications schemes. The meshes may vary in porosity/solidity for varying heat transport considerations and/or for radiation transport considerations form die to die and/or between die and waveguide.

The optical properties of die surfaces may be configured to optimize radiative power and/or communication schemes. Examples include the use of high reflectivity diffuse die surfaces to increase the potential for optical communication between any point on an optical mesh and any point on a die.

Woven meshes can be biaxial or triaxial and incorporate a number of weave styles with one or more optical and or electronic conduits per unit spacing e.g. each conduit may be made up of multiple connected or isolated subconduits. Examples include multifilar wire and metallic wire helically wrapped around optical conduits.

Many of the limitations of microelectronics design can be attributed to the problem of combining media with varying thermal expansion coefficients and the failures from the associated stress and strain. The present invention allows designers to combine a die with widely differing thermal expansion coefficients via the imposition of interstitial compliant meshes and the reduced need for the elevated temperatures associated with soldering. Gallium arsenide, gallium nitride, and silicon die can be used to create higher performance laminates for 3D electronic arrays.

Woven wire meshes can provide electrical conductivity/connectivity. If the wires in one axis of woven wire cloth have a dielectric coating (magnet wire), the mesh is capable of increased addressability to regions of the chip and it is possible to individually address any point on the chip in contact with a mesh node in the case of diodes at the nodes of the mesh. The diodes may instead be a part of the circuitry on the die. Woven wire meshes can also be used for EMI/RFI shielding.

The present invention allows a semiconductor die to have integrated circuits on both sides of the die by providing new and more effective means of electrical power transport, and electrical and optical communication.

Woven meshes including optical conduits (glass or polymer fibers) allow enormous increases in information transport rates, reduced interference, and the ability to transfer optical to electrical power via photovoltaics. Many electronic processes require very low power for operation and silicon is a very efficient photovoltaic material.

The combination of optical fiber arrays and photovoltaic converter regions on the die offers designers a very cost effective means of accelerating the growth of the emerging field of optoelectronics. Much of the effort in the development of optoelectronics is devoted to creating practical waveguides in silicon.

The present invention enables use of optical waveguides external to the die and thereby allows the use of optically efficient low cost glass and polymer materials and this further allows the electronic regions of the die to be more closely spaced as the need for on die optical conduits is negated. Glass and polymer waveguide (fiber) materials may be chosen with higher refractive indices than the surrounding fluid or they can be clad to increase their angular capacity.

Optical communication may be provided between the waveguide and die regions in a variety of schemes with varying degrees of isolation. Radiation transport from off die sources to detectors on the die may be restricted to regions where the waveguide contacts the die or at the other extreme the waveguide array may be caused to transmit and receive radiation along its entire length and bathe the die in radiation of a variety of wavelengths and massively paralleled data communication channels which may be selective accessed and/or modified by die regions. Modification means include selective absorption, reflection, and/or wavelength modification. Die to die and die to waveguide optical communication links can also be created by placing LASERs and/or LEDs on pads on the die.

Use of the invention in combination with a massively paralled and neural net type circuits is contemplated.

LASERs and LEDs are available with a wide range of output frequencies and local regions of the die (detectors) may be tuned/filtered to receive/recognize certain frequencies and/or certain combinations of frequencies and thereby provide further increases in communication bandwidth via wavelength division multiplexing.

Integrated circuit design is constrained in part by the need to transport power and information through metallic conduits in the die and the need to prevent electrical communication with the metallic conduits associated with other operations and this constraint causes the die manufacture to be of increased complexity and cost as multiple layer are required to prevent undesired electrical communication. These considerations also cause designers to group (organize) processes on the die to minimize the need for the metallic conduits.

The present invention allows a large number of non-interfering metallic conduits external to the die for die to die and die to off die power and information transport via sinuous metallic conduits isolated by space in one axis and by dielectric media from the metallic conduits in the opposite axis. Dielectrically coated woven metal mesh arrays solve the problem of crossing electrical conductors without electrical contact.

The off die metallic conduit arrays also allows integrated circuit designers to more closely space operative elements on the die, reduce the number of layers needed for electrical power and communication, and to reacess the need to group processes on the die for the purpose of reducing the need for metallic conduits.

Silicon is the dominant material substrate in microelectronics design and it is amenable to the manufacture of very efficient detectors including photovoltaic type detectors but it has so far proven difficult to manufacture efficient light emitters on silicon substrates. Recent promising developments in this area include the use of rare earth dopants to create light emitting regions on silicon substrates.

The present invention benefits from silicon light emitters but it also allows the use of electronic substrates currently amenable to the creation of efficient light emitters to be used in conjunction with silicon substrates. Examples of substrates/materials for efficient light emitters that can be used in laminates with silicon substrates in the present invention include gallium nitride on sapphire substrates, gallium nitride on silicon carbide substrates, gallium arsenide substrates and a variety of phosphide substrates.

Light emitters may also be mechanically and electrically attached to the meshes of the present invention and/or to pads on the neighboring die.

Electronic integrated circuits are typically created on thin planar substrates and this allows short thermal communication paths. 3D electronic assemblies are achieved by the stacking of semiconductor die to reduce system volume and/or to reduce the problems associated with long electron path lengths. 3D electronic assemblies have traditionally included one active die (high electrical and thermal power density) and a number of passive die (low electrical and thermal power density) to allow heat transport rates sufficient to maintain die temperatures associated with reasonable lifetimes. The present invention allows very large populations of very high power density die to be placed in very close proximity, and thereby allowing the manufacture of processing, communication, and power conversion systems with greatly reduced cost, mass, and volume. In addition to the thermal issues associated with 3D electronic systems, they have also been costly to manufacture because of the difficulties associated with the large number of communication and power transport links required and the limited ability for rework. The present invention overcomes these traditional limitations and grants designers the ability to access a large number of locations on one or both faces of each die via interstitial meshes that provide periodic electronic and/or photonic conduits that can be easily coupled to input and/or output circuitry by extending the meshes beyond the die edges.

Electronic and or photonic communication and power transport schemes possible with the present invention include:

Meshes with metallic wires in one axis and optical fibers in the remaining axes with the metallic conduits used to provide power and possibly low data rate communication and the optical fiber array used for high data rate communication;

Meshes with metallic wires in one or more axes with opposing electrical polarities on opposite sides of the die and through die electrical vias for power and/or communication;

Meshes with multiaxial optical fiber arrays on one side of the die and multiaxial metal wire arrays on the opposite side of the die. Stacked die would result in optical arrays alternating with electrical arrays in the spaces between the die layers.

The ability to use pressure type contacts in the present invention is attractive because it reduces the need for the high temperatures associated with soldering and it allows rework for 3D electronics. Mechanical compliance within the stacked electronic/optoelectronic assemblage may be required to insure proper electrical and or optical communication between the stacked die and the interstitial meshes.

Means to provide mechanical compliance in the present invention include the use of elastically and /or plastically deformable metal meshes, meshes composed of metal wires in one axis and polymer electronic and/or photonic conductors in the opposite axis, and meshes composed of polymer electronic and/or photonic conductors in both axes.

Examples of materials for compliant metal meshes composed of metal wires in both axes include annealed copper, silver, and gold woven wire cloth with appropriate coatings/platings. Compliance may be enhanced by means including the use of polymer coatings, metallic platings, annealing, minimizing wire diameter (continuously and/or periodically) normal to the plane of the enclosing faces, and/or by the use of wires with differing ratios of resistance to elastic and plastic deformation in opposing axes and/or by the use of multiple wire conductors (stranded or multifilar).

Examples of materials for compliant meshes composed of metal wires in one axis and polymer fibers in the opposing axis include metal wires from the group that includes copper, nickel, silver, and gold with appropriate coatings/platings and polymer fibers in the opposite axis from the group that includes acrylics, silicones, urethanes, and polymethylpentenes.

Examples of materials for compliant meshes composed of polymer fibers in both axes include polymers such as acrylics, silicones, urethanes, and polymethylpentenes. Polymer fibers can be used as electronic and/or photonic conduits. Electrical conductivity in polymer fibers can be increased by the use of intrinsically conductive polymers, carbon addition, linear or helically wrapped metal wires, and/or conductive coatings/platings including transparent electrically conductive coatings such as indium tin oxide.

Enclosures for the proposed assemblages may be constructed from metals, polymers, ceramics, and/or glasses an the systems incorporating these assemblages may be divided into modular elements or integrated closely with additional elements including pumps for liquid flow and fans and fin arrays for transporting the heat from the active regions to the local environment.

Contact and communication between integrated circuit die and the proposed interstitial meshes can be provided by known means such as soldering and/or via pressure type contact. Pressure contact may be effected by the use of external springs or screws and/or by the elastoplastic deformation of the interstitial meshes.

FIG. 20 shows a woven wire mesh 375 having elongated electrical elements 376 and 377 in array forming directions relative to circuitry 378 on an integrated circuit unit or die 379 which overlies the mesh. An upper cover 380 extends over unit 379 and has projecting ends 381 and 382.

Another integrated circuit unit 383 may also be provided to underlie the mesh 375, and a lower cover 384 may underlie unit 383. Cover 384 has projecting ends 385 and 386. Fasteners 387 and 388 may be provided to extend downwardly through the projecting ends 381 and 387, and through the projecting ends. When tightened, the fasteners clamp the assembly 379, 375 and 383 together, exerting pressure on the mesh electrical contact points 390 engaging points 391 on the upper unit 379, and also pressurizing the mesh contact points 392 engaging points 393 on the lower unit 383. Controls 396 operate to control energization of the mesh elements 376 and 373.

The fasteners and covers provide clamping means. See also coolant flow at 401. The mesh itself may be springy to maintain pressure at points of engagement 390 and 391 or other means scan be used to maintain such pressure at such points, i.e. external springs or elastoplastic composition of the mesh, or parts thereof.

I claim:

1. The method of communicating with circuitry that includes:
    a) providing a woven mesh having elongated conductive elements extending in array forming directions relative to said circuitry, the array defining a plane or planes,
    b) establishing communication sites associated with the mesh elements, located in spaced apart relation,
    c) operating said sites via the mesh to communicate with said circuitry, having detection capability,
    d) flowing coolant fluid through the mesh in the plane or planes of the array,
    e) said circuitry provided on one or more dies having a side or sides facing said sites and said mesh,
    f) said mesh located between two of said dies provided at opposite sides of the mesh, and compressing said mesh between said dies.

2. The method of claim 1 wherein certain of such elongated elements are provided as one of the following:
    i) optical tubes,
    ii) optical conductors,
    iii) optical conduits,
    iv) radiation conduits.

3. The method of claim 2 including establishing light escape loci spaced along said mesh.

4. The method of claim 2 wherein others of said elongated elements are provided as elongated metallic elements crossing over said mesh.

5. The method of claim 1 wherein said mesh has opposite sides, and at least one of said sides is positioned in site contrasting relation to a die carrying said circuitry.

6. The method of claim 1 wherein step b) includes one of the following:
    i) locating LEDs at said sites, with orientation so that LED light is communicated to said circuitry for detection, and
    ii) locating LASERS at said sites.

7. The method of claim 6 including differentially controlling emission operation of said LEDs in at least one of the following modes:
    i) light from differentiated sites, ii) LED emitted light frequency,
iii) LED emitted light duration,
iv) LED emitted light phase.

8. The method of claim 6 including locating optical detectors associated with said circuitry, in the paths of light transmission from said LEDs or LASERS.

9. The method of claim 1 wherein said elements are interwoven to provide element hills and valleys, and locating LEDs proximate certain of said hills and distributed over said array.

10. The method of claim 1 wherein said circuitry is provided on one or more dies having a side or sides facing said sites and said mesh.

11. The method of claim 1 wherein said elements extend in X and Y directions, and light is emitted in a Z direction, of a rectangular coordinate system.

12. Apparatus for communicating with a circuitry unit, comprising in combination:
   a) a woven mesh having elongated conductive elements extending in array forming directions relative to said circuitry,
   b) communication sites associated with the mesh elements, located in spaced apart relation,
   c) first means for operating said sites via the mesh elements to communicate with said circuitry unit, having detection capability,
   d) said circuitry unit overlying said sites, and clamping means causing contact points on the circuitry unit to pressurally engage said sites,
   e) and including means for flowing coolant through said clamped mesh.

13. The apparatus of claim 12 wherein certain of such elongated elements are provided as optical tubes.

14. Apparatus of claim 13 including light escape loci spaced along said mesh.

15. Apparatus of claim 13 wherein other of said elongated elements are provided as elongated metallic elements.

16. The apparatus of claim 12 wherein the mesh has opposite sides, and at least one of said sides is positioned in site contrasting relation to a die carrying said circuitry unit.

17. The apparatus of claim 12 wherein said sites include LEDs oriented so that LED light is communicated to said circuitry for detection.

18. The apparatus of claim 17 wherein said means controls the LEDs in at least one of the following modes:
   i) light from differentiated sites control,
   ii) LED emitted light frequency,
   iii) LED emitted light duration,
   iv) LED emitted light phase.

19. Apparatus of claim 17 including optical detectors associated with said circuitry unit, in the paths of light transmission from said LEDs.

20. Apparatus of claim 17 wherein said elements are interwoven to provide element hills and valleys, said LEDs located at certain of said hills distributed over said array.

21. Apparatus of claim 12 wherein said circuitry unit is provided on one or more dies having a side or sides facing said sites and said mesh.

22. Apparatus for communicating with a circuitry unit, comprising in combination:
   a) a woven mesh having elongated conductive elements extending in array forming directions relative to said circuitry,
   b) communication sites associated with the mesh elements, located in spaced apart relation,
   c) first means for operating said sites via the mesh elements to communicate with said circuitry, having detection capability,
   d) and wherein said circuitry is provided on one or more dies having a side or sides facing said sites and said mesh,
   e) and wherein said mesh is located between two of said dies provided at opposite sides of the mesh,
   f) and including means for flowing coolant through the mesh, and between said dies.

23. The combination of claim 22 including said circuitry unit overlying said sites, and clamping means causing contact points on the circuitry unit to pressurally engage said sites.

24. The combination of claim 23 wherein said clamping means includes one of the following:
   i) covers and fasteners tightened to cause the covers to clamp the mesh and circuitry unit together at said sites and contact points on the circuitry unit,
   ii) external spring or springs,
   iii) elastoplastic composition of the mesh,
   iv) springy condition of the mesh.

25. Apparatus for communicating with a circuitry unit, comprising in combination:
   a) a woven mesh having elongated conductive elements extending in array forming directions relative to said circuitry,
   b) communication sites associated with the mesh elements, located in spaced apart relation,
   c) first means for operating said sites via the mesh elements to communicate with said circuitry unit, having detection capability,
   d) said circuitry unit overlying said sites, and clamping means causing contact points on the circuitry unit to pressurally engage said sites,
   e) and including means for flowing coolant through said clamped mesh,
   f) and wherein said elements are provided as optical fibers extending in different directions.

26. Apparatus for communicating with a circuitry unit, comprising in combination:
   a) a woven mesh having elongated conductive elements extending in array forming directions relative to said circuitry,
   b) communication sites associated with the mesh elements, located in spaced apart relation,
   c) first means for operating said sites via the mesh elements to communicate with said circuitry, having detection capability,
   d) and wherein said circuitry is provided on one or more dies having a side or sides facing said sites and said mesh,
   e) and wherein said mesh is located between two of said dies provided at opposite sides of the mesh,
   f) and wherein said sites are at one side of the mesh, confronting one die, and wherein support balls are provided at the opposite side of the mesh, facing the other die.

* * * * *